United States Patent
Talledo et al.

(10) Patent No.: US 7,061,294 B1
(45) Date of Patent: Jun. 13, 2006

(54) CLOCK PROCESSING LOGIC AND METHOD FOR DETERMINING CLOCK SIGNAL CHARACTERISTICS IN REFERENCE VOLTAGE AND TEMPERATURE VARYING ENVIRONMENTS

(75) Inventors: Cesar A. Talledo, San Jose, CA (US); Daniel R. Steinberg, Mountain View, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/042,395

(22) Filed: Jan. 25, 2005

Related U.S. Application Data

(60) Division of application No. 10/621,055, filed on Jul. 15, 2003, now Pat. No. 6,867,630, which is a continuation-in-part of application No. 10/094,101, filed on Mar. 8, 2002, now Pat. No. 6,664,838.

(60) Provisional application No. 60/316,399, filed on Aug. 31, 2001.

(51) Int. Cl.
*G05F 1/04* (2006.01)
*H03K 3/00* (2006.01)

(52) U.S. Cl. ...................... 327/291; 327/299
(58) Field of Classification Search ................ 327/291, 327/299
See application file for complete search history.

(56) References Cited

U.S. PATENT DOCUMENTS

| | | | | |
|---|---|---|---|---|
| 6,009,132 A | * | 12/1999 | Scholtz | 375/355 |
| 6,031,401 A | | 2/2000 | Dasgupta | 327/116 |
| 6,548,997 B1 | | 4/2003 | Bronfer et al. | 324/76.48 |
| 6,721,255 B1 | | 4/2004 | Gushima et al. | 369/59.12 |
| 6,725,391 B1 | * | 4/2004 | Swoboda | 713/500 |

OTHER PUBLICATIONS

Ryan, Kevin, "DDR SDRAM Functionality and Controller Read Data Capture," DesignLine, Micron Technology, Inc., vol. 8, Issue 3, 3Q99.

* cited by examiner

*Primary Examiner*—Quan Tra
(74) *Attorney, Agent, or Firm*—Glass & Associates

(57) ABSTRACT

Clock processing logic and method for determining clock signal characteristics in reference voltage and temperature varying environments are described. A sample vector is characterized by bit locations corresponding to sequentially increasing delay values so that values stored in such bit locations indicate clock signal edges where value transitions occur. In one embodiment, edge detection logic and sensitivity adjustment logic are used in determining the clock period from such a sample vector. In another embodiment, an edge filter, sample accumulation logic, and clock period and jitter processing logic are used in determining an average clock period and clock jitter from a predefined number of such sample vectors.

21 Claims, 16 Drawing Sheets

CLOCK PROCESSING LOGIC AND METHOD FOR DETERMINING CLOCK SIGNAL CHARACTERISTICS IN REFERENCE VOLTAGE AND TEMPERATURE VARYING ENVIRONMENTS

CROSS REFERENCE TO RELATED APPLICATIONS

This application is a divisional of commonly-owned U.S. patent application Ser. No. 10/621,055, filed Jul. 15, 2003, now U.S. Pat. No. 6,867,630, which is a continuation-in-part of commonly-owned U.S. patent application Ser. No. 10/094,101, filed Mar. 8, 2002, now U.S. Pat. No. 6,664,838, which claims priority from commonly-owned U.S. provisional application Ser. No. 60/316,399, filed Aug. 31, 2001, each of which is incorporated by reference to the extent consistent herein.

FIELD OF THE INVENTION

The present invention generally relates to clock signal processing and in particular, to a clock processing logic and method for determining clock signal characteristics in reference voltage and temperature varying environments.

BACKGROUND OF THE INVENTION

Clock processing logic and method for determining clock signal characteristics in reference voltage and temperature varying environments are useful in many applications including those for generating a compensated percent-of-clock period delay signal. The generation of compensated percent-of-clock period delay signals is, in turn, also useful in many applications. As an example, such a delayed version of a data strobe signal (DQS) is useful for capturing read data (DQ) provided along and edge-aligned with the DQS from a double data rate (DDR) synchronous dynamic random access memory (SDRAM).

The benefits of DDR SDRAMs are well known. Simply put, DDR SDRAMs are probably the most straightforward and least costly approach to doubling memory data bandwidth over the single data rate SDRAMs in common use today.

Read data capture at the memory controller, however, can be a significant challenge using DDR SDRAMs. To assist in read data capture, the DDR SDRAM provides one or more DQS that are edge-aligned with corresponding DQ provided by the DDR SDRAM during a read operation. To capture the data, the memory controller internally delays the received DQS to be within a data valid window, and then captures the DQ using the thus delayed DQS.

The optimal delay for DQS is the average location of the center of the data valid window, taking into account the maximum skew between DQS and DQ (DQSQ") and the reduced data valid window (DV") realized at the memory controller. DQSQ" in this case is the sum of the nominal skew between any data line and its corresponding DQS at the pins of the DDR SDRAM (DQSQ) plus skew additions that are incurred between the DDR SDRAM and the memory controller. For example, in a system where the memory controller is on a separate chip than the DDR SDRAM, such skew additions include board effects between the DDR SDRAM and the chip, and internal routing within the chip. Likewise, DV" in this case is the nominal DDR SDRAM data valid window at the pins of the DDR SDRAM (DV) reduced by the skew additions.

A percent-of-clock period delay is only one possible approach for implementing the DQS delay for read data capture. Other approaches include using a predetermined absolute delay value or a selectable delay. Each of these implementations, however, is susceptible to process, voltage and temperature variations that may significantly alter the value of their delay line. Such variations may destroy the limited timing budget available for read data capture. Thus, most systems could benefit from a delay implementation that addresses one or more of these error-producing variations.

Delay locked loops (DLLs) have been proposed to compensate for at least reference voltage and temperature variations in the predetermined absolute delay value and selectable delay implementations. A DLL locked to the clock is also thought to be required in a percent-of-clock period delay implementation. However, multiple clock periods are generally required for the DLL to "lock" in these implementations, thereby objectionably adding to the effective read access time in short burst read data captures.

OBJECTS AND SUMMARY OF THE INVENTION

It is an object of the present invention to provide a clock processing logic and method useful for determining clock signal characteristics in reference voltage and temperature varying environments.

Another object is to provide a clock processing logic and method useful for generating a compensated percent-of-clock period delayed signal that compensates for reference voltage and temperature variations.

Still another object is to provide a clock processing logic and method useful for generating a compensated percent-of-clock period delayed signal that is cost effective and simple to implement.

Another object is to provide a clock processing logic and method useful for clock edge detection in a noisy environment.

Yet another object is to provide a clock processing logic and method useful for on-chip measurement of the period of and jitter on a clock signal.

These and additional objects are accomplished by the various aspects of the present invention, wherein briefly stated, one aspect is a clock processing logic for determining an edge of a clock signal indicated in a sample vector by a bit location corresponding to a transition from one or more bits of a first value on one side of the bit location to one or more bits of a second value on another side of the bit location, wherein the bit location varies from cycle to cycle according to reference voltage and temperature variations affecting the clock signal. Included in the clock processing logic are edge detection logic and sensitivity adjustment logic. The edge detection logic is configured to compare adjacent pairs of bits of the sample vector starting from one end of the sample vector to another end of the sample vector until a bit location corresponding to a transition from one or more bits of a first value on one side of the bit location to one or more bits of a second value on another side of the bit location is detected. The sensitivity adjustment logic is configured to adjust the bit location according to information of at least one other bit location corresponding to a previous cycle of the clock signal that was previously detected by the edge detection logic.

Another aspect of the invention is a method for processing a sample vector indicating an edge of a clock signal by a bit location corresponding to a transition from one or more bits of a first value on one side of the bit location to one or more bits of a second value on another side of the bit location, wherein the bit location varies from cycle to cycle according to reference voltage and temperature variations affecting the clock signal. Included in the method are: detecting a bit location corresponding to a transition from one or more bits of a first value on one side of the bit location to one or more bits of a second value on another side of the bit location; and adjusting the bit location according to information of at least one other bit location corresponding to a previous cycle of the clock signal that was previously detected.

Still another aspect of the invention is a clock processing logic for determining an average clock period and jitter for a clock signal characterized by sample vectors taken on a per cycle basis of the clock signal, wherein individual of the sample vectors indicate at least one edge of the clock signal by a bit location varying from cycle to cycle according to reference voltage and temperature variations affecting the clock signal and corresponding to a transition from one or more bits of a first value on one side of the bit location to one or more bits of a second value on another side of the bit location. Included in the clock processing logic are an edge filter, sample accumulation logic, and clock period and jitter processing logic. The edge filter is configured to generate filtered sample vectors by marking only bit locations corresponding to edges of a clock signal as indicated in the sample vectors. The sample accumulation logic is configured to generate accumulative sample vectors by logically OR-ing a predefined number of the filtered sample vectors for individual of the accumulative sample vectors. The clock period and jitter processing logic is configured to determine a clock period and jitter on the clock signal for individual of the accumulative sample vectors.

Yet another aspect of the invention is a method for determining an average clock period and jitter for a clock signal characterized by sample vectors taken on a per cycle basis of the clock signal, wherein individual of the sample vectors indicate at least one edge of the clock signal by a bit location varying from cycle to cycle according to reference voltage and temperature variations affecting the clock signal and corresponding to a transition from one or more bits of a first value on one side of the bit location to one or more bits of a second value on another side of the bit location. Included in the method are: generating filtered sample vectors by marking only bit locations corresponding to edges of a clock signal as indicated in the sample vectors; generating accumulative sample vectors by logically OR-ing a predefined number of the filtered sample vectors for individual of the accumulative sample vectors; and determining a clock period and jitter on the clock signal for individual of the accumulative sample vectors.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

Figure 1:
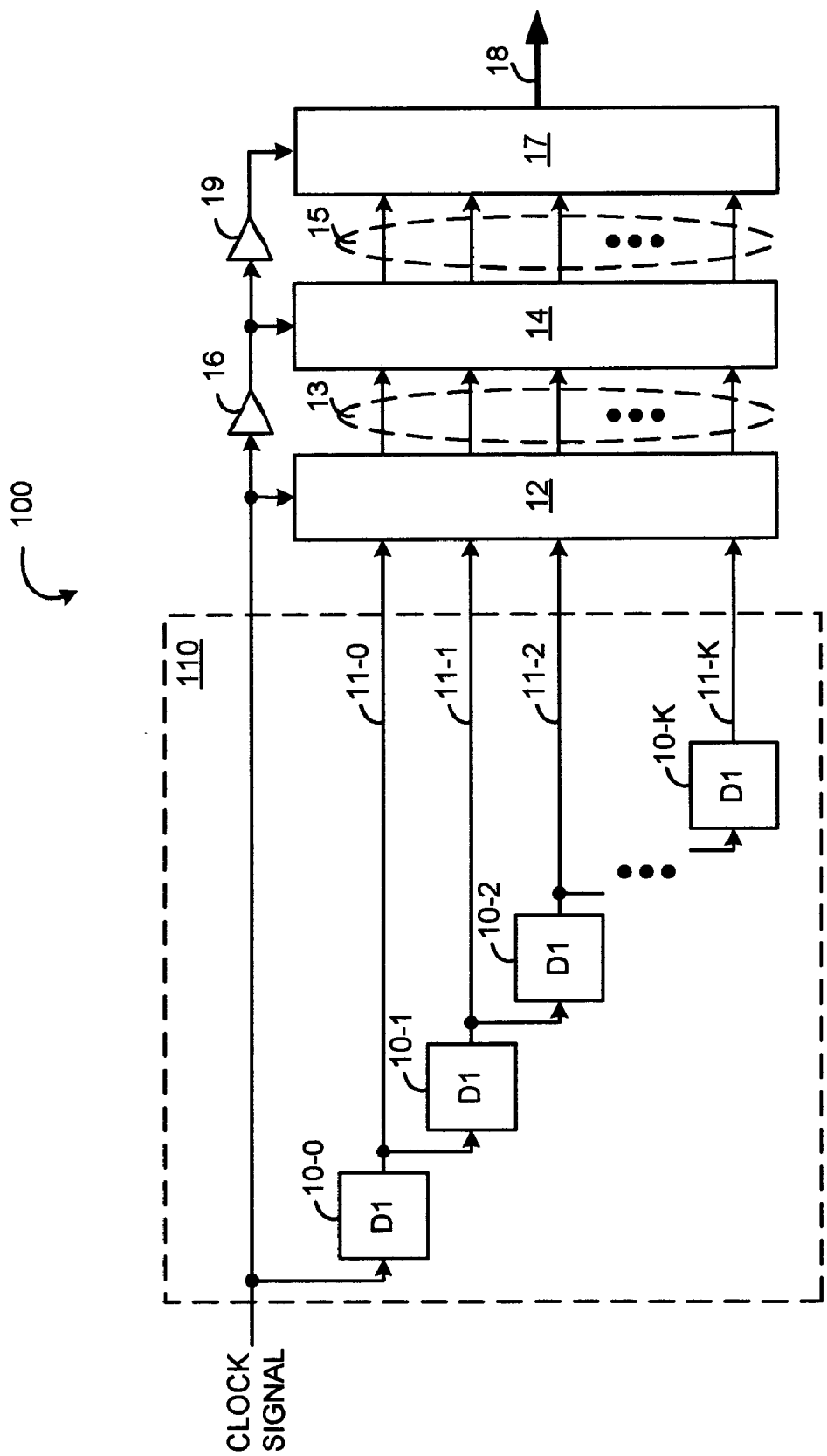
FIG. 1 illustrates, as an example, a first circuit as part of an apparatus for generating a compensated percent-of-clock period delayed signal, utilizing aspects of the present invention.

FIG. 1 illustrates, as an example, a first circuit 100 as part of an apparatus for generating a compensated percent-of-clock period delayed signal. A first delay tree 110 has (K+1) delay branches 11-0 to 11-K that are sequentially configured so as to have increasing numbers of serially coupled first delay elements individually of substantially a first delay value D1, so that each of the branches provides incrementally more delay than a previous branch in sequence. In particular, in the first delay tree 110, a first delay branch 11-0 includes a single delay element 10-0, a second delay branch 11-1 includes two delay elements 10-0 and 10-1, a third delay branch 11-2 includes three delay elements 10-0, 10-1, and 10-2, and so on, down to a (K+1)th delay branch 11-K that includes K+1 delay elements 10-0 to 10-K.

A clock signal is provided to each of the delay branches 11-0 to 11-K through their common delay element 10-0, to an enable input of a first register 12, and to a buffer 16. Outputs of the delay branches 11-0 to 11-K are coupled to corresponding inputs of the first register 12. The first register 12 is enabled to capture values on the outputs of the delay branches 11-0 to 11-K on rising edges of the clock signal. Consequently, a low logic state is captured on the output 13 for each delay branch through which the previous rising and falling edges of the clock signal have passed through when the subsequent rising edge of the clock signal enables the first register 12; a high logic state is captured on the output 13 for each delay branch through which the previous rising edge of the clock signal has passed through, but the falling edge has not passed through yet when the subsequent rising edge of the clock signal enables the register 12; and a low logic state is captured on the output 13 for each delay branch through which the previous rising edge of the clock signal has not passed through yet when the subsequent rising edge of the clock signal enables the register 12. Thus, the output 13 of the first register 12 is indicative of the number of serially coupled delay elements through which a rising edge of the clock signal has passed through during one period of the clock signal.

The delay elements 10-0 to 10-K are generally sensitive to reference voltage and temperature variations. The clock signal, on the other hand, should be relatively insensitive to such variations. A system clock is generally capable of providing such a clock signal. As a result of such relative sensitivities between the clock signal and delay elements, the number of serially coupled delay elements through which a rising edge of the clock signal passes through during one period of the clock signal changes with reference voltage and/or temperature variations.

A second register 14 has inputs coupled to corresponding outputs of the first register 12 as in a conventional "pipelined" architecture. The second register 14 is also enabled by the clock signal through the buffer 16. Even if one or more of the output 13 are metastable, inclusion of the second register 14 ensures that the second stage output 15 are all stable (i.e., have all settled down to valid logic states).

The second stage output 15 thus results in a "sample vector" with each of its bit locations representing a "sample" delayed in time from a prior sample (i.e., bit location) by the incremental delay value being added by its corresponding delay branch in the Master Delay Tree circuit 31. An "edge transition" occurs in the sample vector where the bits change logic states (e.g., change from "0's" on one side of the edge transition to "1's" on the other side, or "1's" on one side of the edge transition to "0's on the other side). A "positive edge transition" in this case, identifies the delay branch (e.g., the last one indicating a "0" or the first one indicating a "1", depending upon which convention is selected), among the delay branches 11-0 to 11-K, that has approximately the same combined delay from its delay elements as the period of the clock signal. Since each of the delay branches 11-0 to 11-K also has a different number of delay elements in it, the positive edge transition also indirectly indicates that number when identifying the branch.

False readings (also referred to herein as "false samples") on one or more of the output 13 and consequently, on corresponding of the output 15 may occur due to the first register 12 latching (also referred to herein as "sampling") certain outputs of the delay branches 11-0 to 11-K that are metastable. Metastability in this case may result if the value in any one of the delay branches 11-0 to 11-K is transitioning during the set-up and hold time of the register 12 when it is being enabled. Factors that determine which one of the branches violates such set-up and hold times include the power supply levels, noise, and/or system temperature affecting the value D1 of the delay elements 10-0 to 10-K, the period of a system clock generating the clock signal being affected by jitter and/or its frequency varying from system to system, or the non-zero rise time of the clock signal.

DQS delay control logic ("DDCL") 17 receives the output 15, and processes the sample vector provided thereon to determine the correct edge transition in light of possible false samples. It does this by performing two functions on the sample vector.

First, the DDCL 17 locates the earliest positive edge transition in the sample vector. The earliest or first positive edge transition is located in this case, because the sample vector may contain for some reason more than one period of the clock signal. For example, more than one positive edge transition may occur if the combined delay of the last delay branch 11-K is greater than a period of the clock signal.

Second, the DDCL 17 compares the position of the newly detected positive edge transition with positions of one or more previously detected positive edge transitions of prior clock periods, and modifies its position as necessary to avoid abrupt adjustment position changes between adjacent clock periods. This function is desirable so that the DDCL 17 provides its output 18 in a manner that adjusts smoothly over time for changes in temperature and/or voltage. In particular, it prevents power supply noise from disrupting valid edge transition detections. The following procedure is one method of performing this second function:

```
if (new_posedge_position<=prev_posedge_position-2)
    posedge_position=prev_posedge_position-1;
else if new_posedge_position=>prev_posedge_position+2)
    posedge_position=prev_posedge_position+1;
    else posedge_position=new_posedge_position;
```

The procedure causes the DDCL 17 to change its output 18 smoothly in response to reference voltage and/or temperature variations by adjusting the located position of the positive edge transition in the sample vector at most one position per clock period. The output 18 in this case indicates the position of the positive edge transition on the sample vector. The position of the positive edge transition, in turn, indicates which one of the delay branches 11-0 to 11-K has a combined delay from its delay elements that most closely approximates the period of the clock signal during a given period of the clock signal at the then prevalent reference voltage and temperature conditions. Although a threshold value of "2" is used in this example, other values may also be used as determined, for example, by trial-and-error to achieve maximal results.

Alternatively, the second function of the DDCL 17 may be performed using a moving average or other averaging technique. Such techniques would not only avoid abrupt changes of the positive edge transition detected between successive clock periods, but would also prevent "drift" errors that might occur using the prior described technique. As a simple example of a moving average technique, the position of the current positive edge transition may be taken as the average of the current and the nine previously determined positions.

Figure 2:
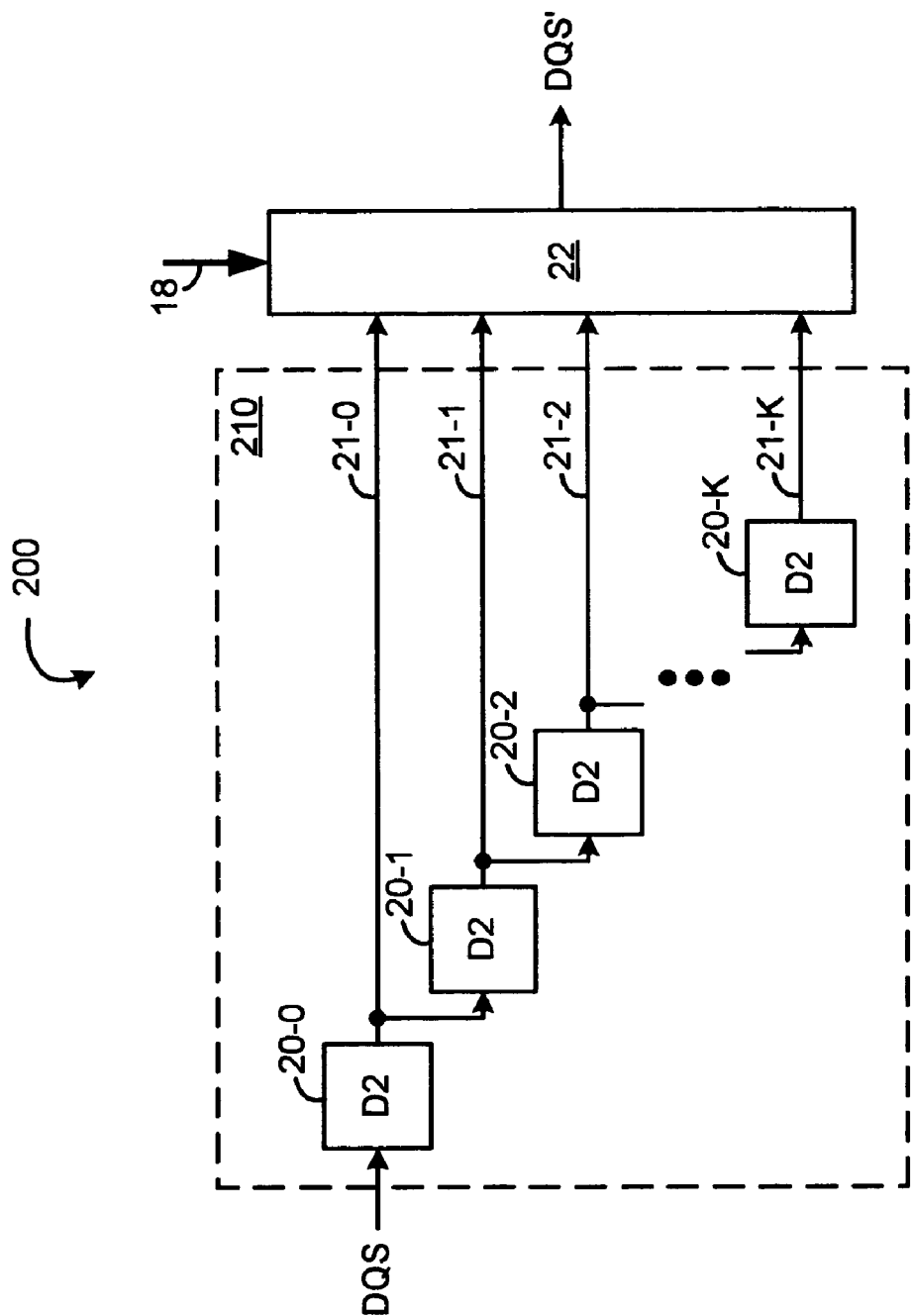
FIG. 2 illustrates, as an example, a second circuit as part of an apparatus for generating a compensated percent-of-clock period delayed signal, utilizing aspects of the present invention.

FIG. 2 illustrates, as an example, a second circuit 200 as part of the apparatus for generating a compensated percent-of-clock period delayed signal. A second delay tree 210 has K delay branches 21-0 to 21-K that are sequentially configured so as to have increasing numbers of serially coupled second delay elements individually of substantially a second delay value D2, so that each of the branches provides incremental more delay than a previous branch in sequence.

The delay branches 21-0 to 21-K of the second delay tree 210 respectively correspond to the delay branches 11-0 to 11-K of the first delay tree 110, so that the ratio of total delay on corresponding branches equal a desired percent-of-clock period. In the present example, where corresponding branches, such as 11-$i$ and 21-$i$ for i=0, 1, ... K, have the same number of delay elements, the percent-of-clock period is equal to the ratio of their respective delay element values. In such case, where the second delay element D2 has a value that is 20% of that of the first delay element D1, then the percent-of-clock period is also 20%. On the other hand, in another example (not shown), where the first and second delay elements, D1 and D2, are equal in value, then corresponding branches in the first and second delay trees, 110 and 210, must have different numbers of delay elements in order for the ratio of total delay on the corresponding branches to be equal to the desired percent-of-clock period. In that case, where the percent-of-clock period is desired to be 20%, the number of delay elements in branches of the first delay tree 110 must be five times as many as their corresponding branches in the second delay tree 210.

A data strobe (DQS) or other signal to be delayed is provided to each of the delay branches 21-0 to 21-K through their common delay element 20-0. Outputs of the delay branches 21-0 to 21-K are coupled to corresponding inputs of a multiplexer 22, and the output 18 of the DDCL 17 of the first circuit 100 is coupled to a select input of the multiplexer 22. Consequently, the output of the branch of the second delay tree 210 that corresponds to the branch of the first delay tree 110 is passed through the multiplexer 22 after being selected according to information on the output 18.

As previously noted, the ratio of total delay on corresponding branches of the first and second delay trees, 110 and 210, equals the desired percent-of-clock period. Therefore, since the total delay on the branch of the first delay tree 110 has been selected such that its delay is approximately equal to the clock period, the total delay on its corresponding branch of the second delay tree 210 is approximately the desired percent-of-clock period. As a result, the output signal DQS' on the output of the multiplexer 22 is the desired percent-of-clock period delayed signal.

In brief summary of FIGS. 1 and 2, the first circuit 100 determines how many delay elements a clock signal passes through during one period of the clock signal. The second circuit 200 then passes a signal DQS to be delayed through the same number of delay elements according to information received from the first circuit 100. The ratio of the values of delay elements in the first and second circuits (i.e., D2/D1) determines the percent-of-clock period that the passed signal is delayed. Since the clock signal is relatively insensitive to reference voltage and temperature variations as compared to the delay elements, 10-0 to 10-K and 20-0 to 20-K, a reasonably constant percent-of-clock period delay is maintained as more or less delay elements are passed through during each successive period of the clock signal.

Figure 3:
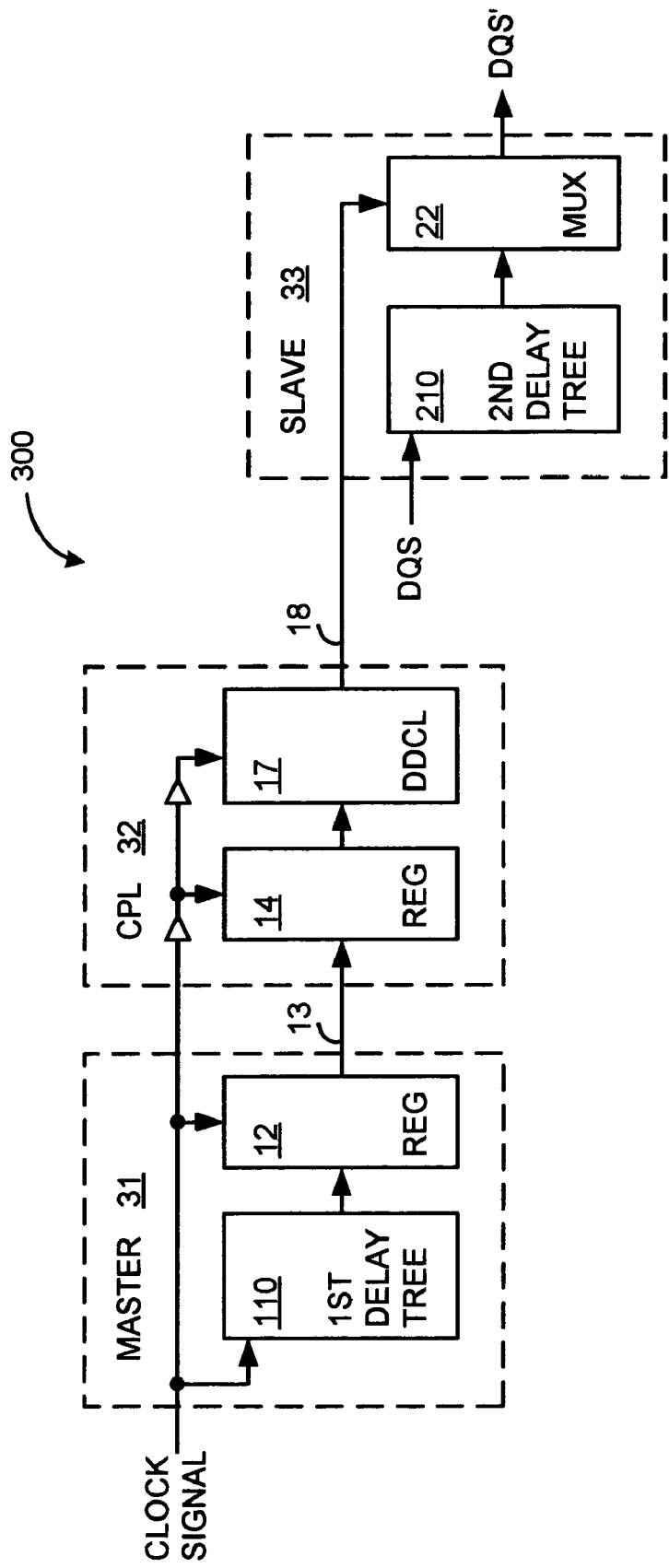
FIG. 3 illustrates a block diagram of a first example of a Percent-Of-Clock Period Delay Generator, utilizing aspects of the present invention.

FIG. 3 illustrates a block diagram of a first example of a Percent-Of-Clock Period Delay Generator 300 formed by combination of the circuits 100 of FIGS. 1 and 200 of FIG. 2. A Master Delay Tree circuit 31 is formed by combination of the first delay tree 110 and the first register 12 of FIG. 1, and a Clock Processing Logic circuit ("CPL") 32 is formed by combination of the second register 14 and the DDCL 17 of FIG. 1. In this example, both the Master Delay Tree circuit 31 and the CPL 32 are driven by the same clock signal ("CLOCK SIGNAL"), which is preferably the system clock signal.

A Slave Delay Tree circuit 33 is formed by combination of the second delay tree 210 and the multiplexer 22 of FIG. 2. As previously described in reference to the operation of the DDCL 17 of FIG. 1, the purpose of the CPL 32 is to process the Sample Vector output 13 of the Master Delay Tree circuit 31, and generate a control signal 18 for the Slave Delay Tree circuit 33 so that a signal DQS provided to the Slave Delay Tree circuit 33 is delayed by the desired percent-of-clock period of the CLOCK SIGNAL to provide output DQS'.

Figure 4:
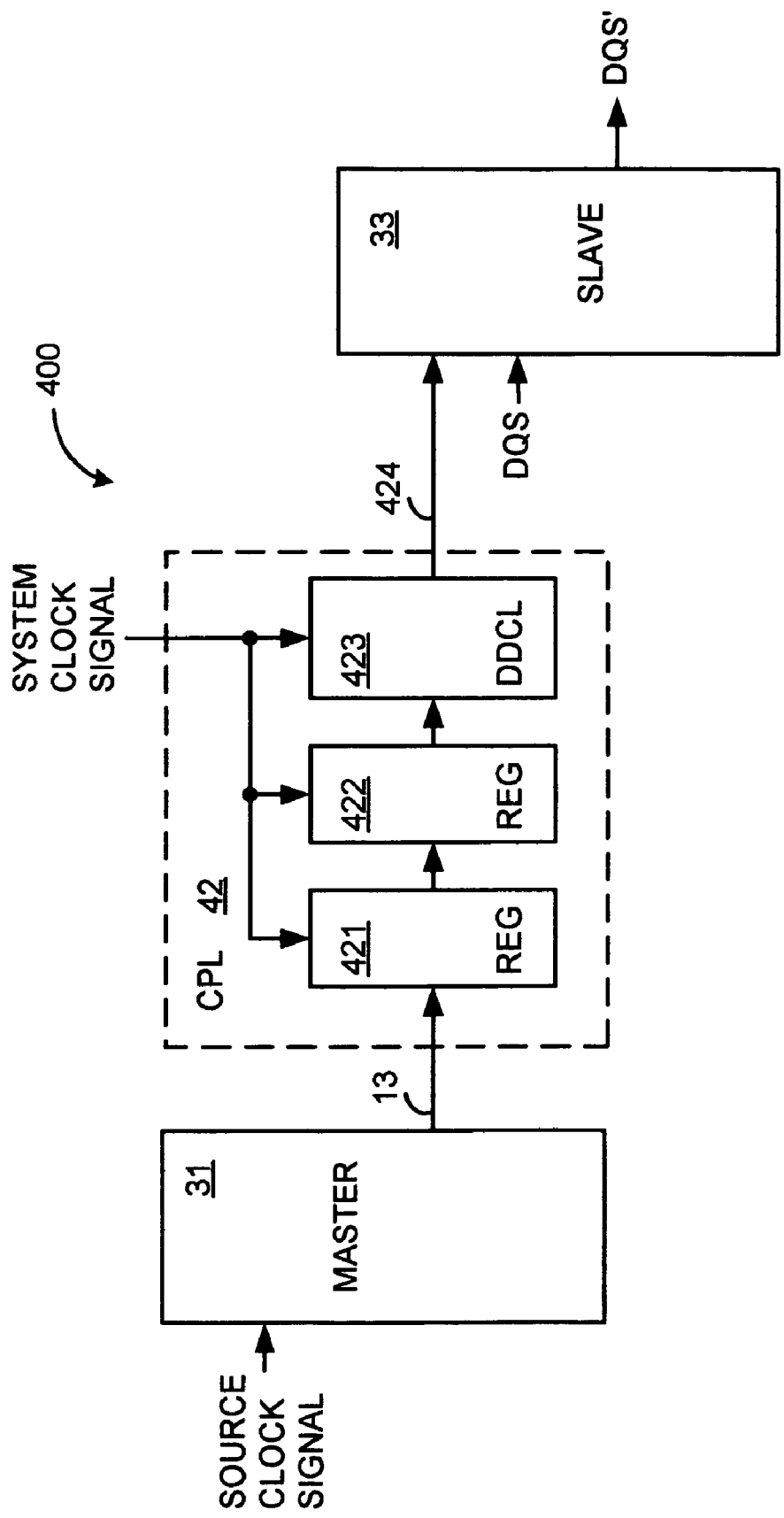
FIG. 4 illustrates a block diagram of a second example of a Percent-Of-Clock Period Delay Generator, utilizing aspects of the present invention.

FIG. 4 illustrates a block diagram of a second example of a Percent-Of-Clock Period Delay Generator 400. In this example, Master and Slave Delay Tree circuits, 31 and 33, operate and are similarly constructed as their identically referenced counterparts in FIG. 3. CPL 42, however, includes an additional register 421, which combines with register 422 to provide a double-registering function on a Sample Vector received as output 13 from the Master Delay Tree circuit 31. The double-registering serves two purposes. First, it increases the time for the Sample Vector (which may be metastable due to race conditions in latching the output 13) to stabilize. Second, it allows decoupling of the Master Delay Tree circuit 31 and CPL 42 clocks, so that different clock signals may be provided to the Master Delay Tree circuit 31 and the CPL 42. In particular, in this example, a source clock signal ("SOURCE CLOCK SIGNAL") is provided to the Master Delay Tree circuit 31 while a system clock signal ("SYSTEM CLOCK SIGNAL") is provided to the CPL 42.

Figure 5:
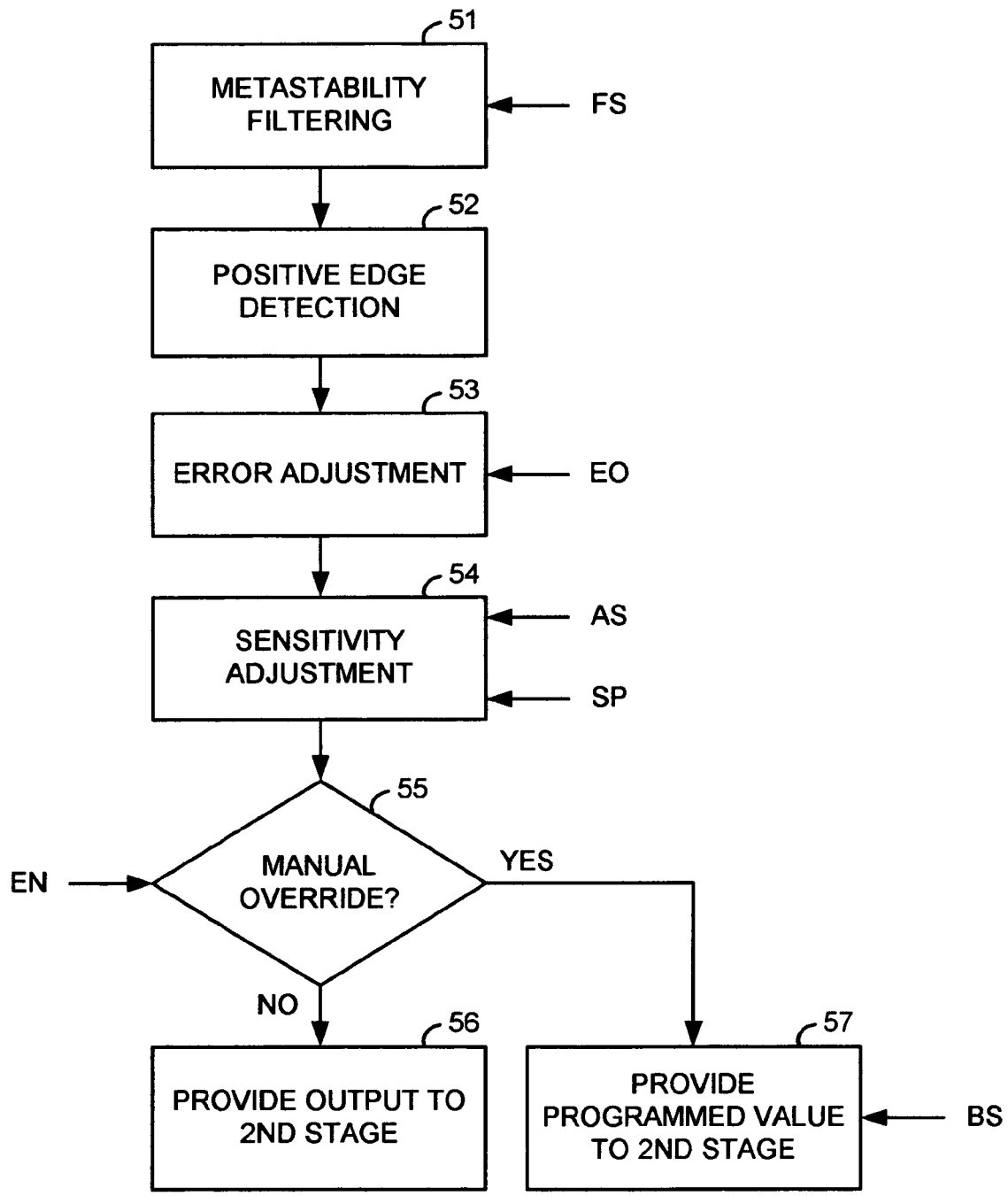
FIG. 5 illustrates, as an example, a flow diagram of various functions performed by a first embodiment of a Clock Processing Logic, utilizing aspects of the present invention.
Figure 6:
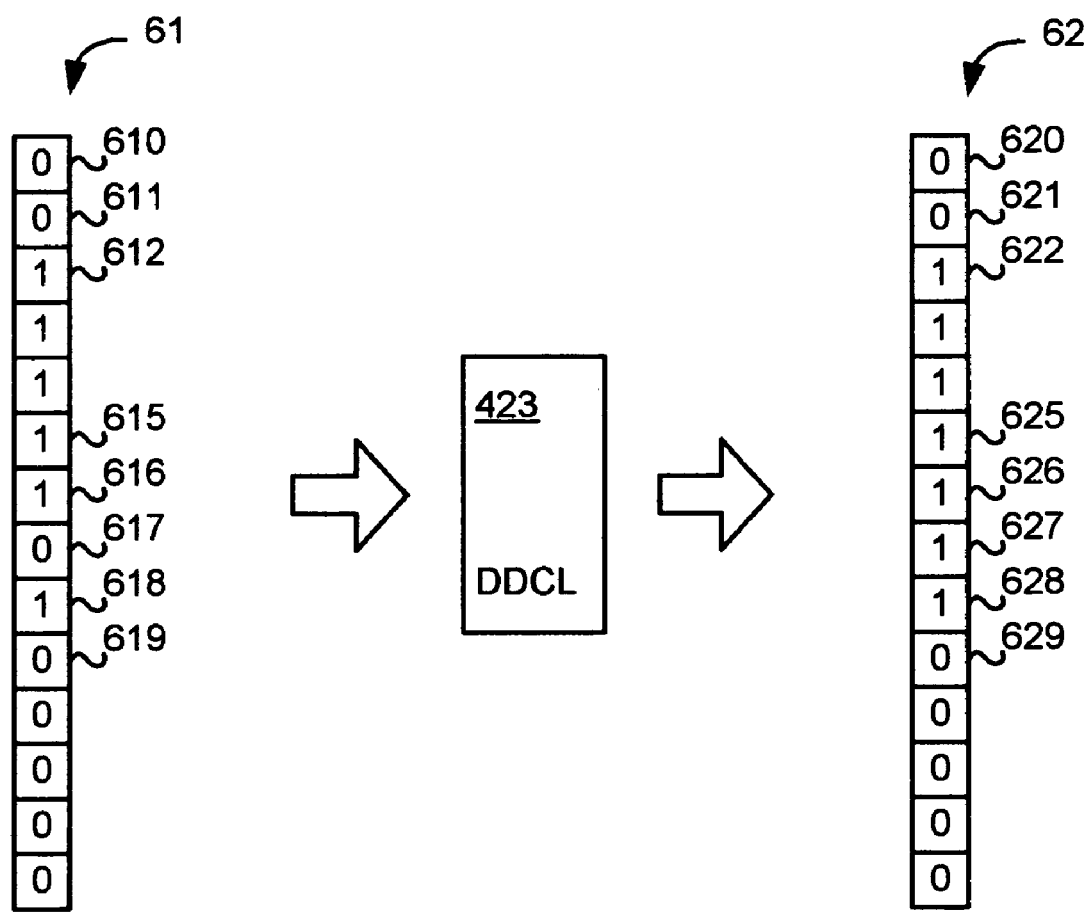
FIG. 6 illustrates, as an example, input and output Sample Vectors for a Metastability Filtering function included in Clock Processing Logic, utilizing aspects of the present invention.
Figure 7:
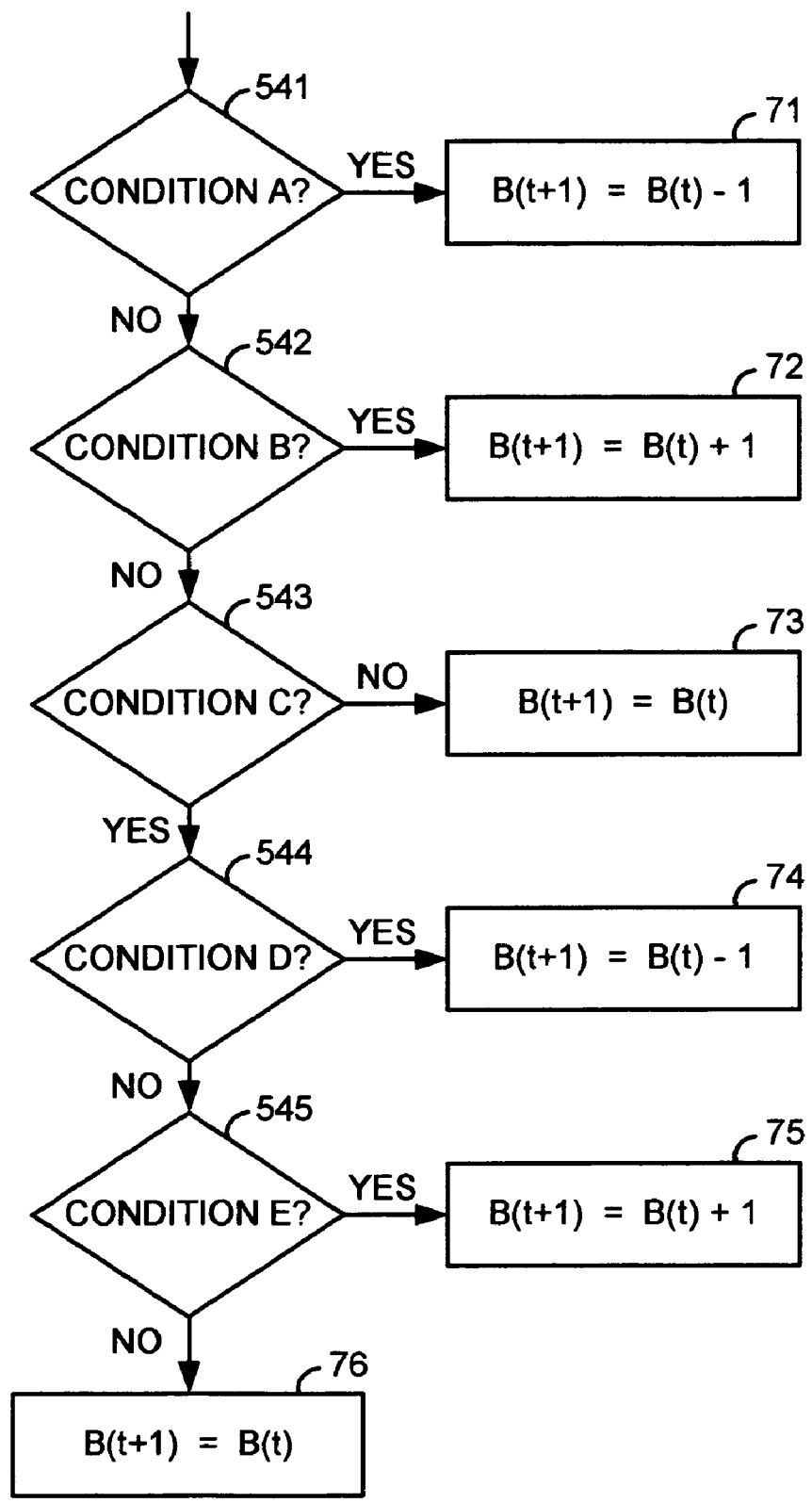
FIG. 7 illustrates, as an example, a flow diagram of a Sensitivity Adjustment function included in Clock Processing Logic, utilizing aspects of the present invention.

Although the DDCL 423 of the CPL 42 may operate and be similarly constructed as its counterpart DDCL 17 of FIG. 1, it is preferably different in certain respects so as to provide enhanced edge detection and/or additional functionality-such as on-chip clock period and clock jitter measurement. FIGS. 5~7 illustrate, as an example, details of one such embodiment of the DDCL 423 providing enhanced edge detection, and FIGS. 8~15 illustrate, as two more examples, details of other embodiments of the DDCL 423 providing additional functionality such as on-chip clock period and clock jitter measurement. In each of these embodiments, the DDCL 423 may be conventionally implemented in hard-wired logic, or using a programmed processor, or using a combination of hardwired logic and programmed processor.

FIG. 5 illustrates various functions performed by a first embodiment of the Clock Processor Logic 42. The DDCL 423, in this case, provides enhanced edge detection on a double-registered Sample Vector received from the register 422. Two primary functions performed by the DDCL 423 include a Positive Edge Detection function 52 and a Sensitivity Adjustment function 54. These functions are generally similar to those described in reference to the operation of the DDCL 17 of FIG. 1, with the exception that the Sensitivity Adjustment function 54 is more sophisticated and provides generally enhanced accuracy than the corresponding function described in reference to the DDCL 17 of FIG. 1. Other functions such as a Metastability Filtering function 51, Error Adjustment function 53, and Manual Override function 55–57 provide additional functionality and flexibility in the edge detection process.

In the Metastability Filtering function 51, the Sample Vector is processed through a metastability filter which "smoothes" out the Sample Vector. Smoothing of the Sample Vector is desirable, because metastability could cause some bits of the Sample Vector to flip value. An example of the Metastability Filtering function 51 is illustrated in FIG. 6 wherein a Sample Vector 61, including false sample bit 617, is received by the DDCL 423, and a filtered Sample Vector 62, including corrected sample bit 627, is outputted by the DDCL 423. The false sample bit 617 in this case is a flipped value, because it failed to meet necessary setup and/or hold times when being latched into the register 12 of the Master Delay Tree circuit 41.

Referring back now to FIG. 5, the following algorithm is implemented in the metastability filter performing the Metastability Filtering function 51:

```
for (i=[FILTERSIZE-1)/2];
    i<BRANCHNUM-(FILTERSIZE+1)/2];
    i=i+1){
    if (FILTERSIZE==3)
        if (in[i-1]+in[1]+in[i+1]>1)
            out[i]=1;
        else
            out[i]-0;
    else
        out[i]=in[i];
}
``` where, "i" is number of the bit location of the Sample Vector being filtered (e.g., ranging from 0 to K); FILTERSIZE=1 or 3 (wherein "1" implies no filtering in this case); and BRANCHNUM=number of branches in the Master Delay Tree circuit 31 (i.e., K+1). Note that in this and other examples herein, bit location [i] of the Sample Vector corresponds to delay branch 11-[i] of the Master Delay Tree circuit 31.

Since the algorithm for the Metastability Filtering function is fully combinational (i.e., no state machines are used in this logic), the Sample Vector can be filtered in a single system clock cycle. The filter size ("FILTERSIZE") is preferably variable so that its value can vary depending on implementation parameters such as the amount of delay per delay element in the Master Delay Tree circuit 31, the source clock's rise time, the source clock's jitter, and the characteristics of the capturing elements (i.e., flip-flops of register 12) used in the Master Delay Tree circuit 31. Accordingly, depending upon such implementation parameters, the filter size may be increased above the 3 bits shown in the example above, or decreased to 1 bit if no filtering is required. The algorithm preferably performs a "majority" function on sets of consecutive bits equal in number to the filter size. In such case, the filter size is preferably an odd number to avoid dead-lock or non-determinative situations. The filter size is stored in a "Filter Size" field ("FS") of a control register (not shown) of the CPL 42.

In the Positive Edge Detection function 52, the first positive edge transition in the filtered Sample Vector is determined. As previously described, finding the first positive edge transition (i.e., a first occurrence of a bit of the Sample Vector in ascending branch order that has a "1" value and is immediately followed by one or more bits having a "0" value) in the filtered Sample Vector is equivalent to determining the delay tree branch that has enough delay to cover one period of the SOURCE CLOCK SIGNAL provided to the Master Delay Tree circuit 31. Since it is preferable there are enough branches in the Master Delay Tree circuit 31 to cover more than one period of the SOURCE CLOCK SIGNAL (to ensure that at least one period of the SOURCE CLOCK SIGNAL is covered, taking into account reference voltage and temperature variation effects on the SOURCE CLOCK SIGNAL), the filtered Sample Vector may have multiple positive edge transitions. By searching for the first positive edge transition, the DDCL 423 ensures that only one period of the SOURCE CLOCK SIGNAL is used in the percent-of-clock period delay generation.

The following algorithm is implemented in a positive edge detection logic performing the Positive Edge Detection function 52:

```
posedgebranch=BRANCHNUM-1;
for (k=0; k<=(BRANCHNUM-2); k=k+1) {
    if ((in[k]==1)&&(in[k+1]==0)) {
        //Positive edge transition found, check if
    earlier positive edge was found
        if (k<posedgebranch)
            posedgebranch=k; //found earlier positive edge
transition
        else
            posedgebranch=posedgebranch;
        }
    else posedgebranch=posedgebranch;
}
``` where, in[k]=bit location [k] of the Sample Vector being input to the positive edge detection logic; and posedgebranch=branch number corresponding to the first positive edge transition in the filtered sample vector.

Since the first positive edge detection algorithm processes the filtered sample vector combinationally, state machines are not necessarily used. This means that the filtered Sample Vector can be processed in a single system clock cycle.

In the Error Adjustment function 53, an error adjustment is applied to the first positive edge transition. The error adjustment is a plus or minus delay value that is effectuated by adjusting the first positive edge transition to a different branch of the Master Delay Tree circuit 31 than the one determined in by the First Positive Edge function 52. The error adjustment is based on a value programmed in an "Error Adjustment or Offset" field ("EO") of a control register (not shown) of the CPL 42. This feature allows correction of known errors in the generation of the percent-of-clock period delayed signal DQS'.

If value other than zero is programmed in the EO field, the Error Adjustment function 53 offsets the first positive edge transition detected by the First Positive Edge function 52 by a number of branches corresponding to the programmed value. For example, a programmed value of 2 will result in moving the first positive edge transition two branches in a positive direction (e.g., from branch 11-$n$ to branch 11-[$n$+2]), and a programmed value of −2 will result in moving the first positive edge transition two branches in a negative direction (e.g., from branch 11-$n$ to branch 11-[$n$−2]). Preferably, the programmed value is 2's complement encoded and in the range of −16 to +15 for a 32-bit Sample Vector. Regardless of the value programmed in the EO field, use of the Error Adjustment function 32 does not disable any other functions of the DDCL 423. Thus, all the advantages of using the Percent-Of-Clock Period Delay Generator 400

(e.g., dynamic temperature adjustment, dynamic voltage adjustment, etc.) are preserved.

Use of the Error Adjustment function 53 assumes that a user is aware of an error in the generation of the delayed signal DQS' generated by the Percent-Of-Clock Period Delay Generator 400. In the case in which the Percent-Of-Clock Period Delay Generator 400 is used in a DDR controller, this assumption is reasonable as the signal to be delayed is used to capture data read from the DDR SDRAM. If the value of the data read is erroneous and the user suspects that the Percent-Of-Clock Period Delay Generator 400 has a problem, the user may iteratively program the EO field and read data from the DDR SDRAM until correct data is captured.

In the Sensitivity Adjustment function 54, the position of the newly determined first positive edge transition is compared with positions of one or more previously determined first positive edge transitions of prior clock periods, and modified according to predefined rules so as to avoid abrupt position changes between adjacent clock periods. In particular, this function controls how sensitive the Percent-Of-Clock Period Delay Generator 400 is to temperature, voltage, source clock jitter, and source clock frequency changes. The "sensitivity" of the Percent-Of-Clock Period Delay Generator 400 is programmed through an "Adjustment Sensitivity" ("AS") field in a control register (not shown) of the CPL 42, and the sensitivity period of the Percent-Of-Clock Period Delay Generator 400 is programmed through a "Sensitivity Period" ("SP") field of a control register (not shown) of the CPL 42.

FIG. 7 illustrates a flow diagram describing the operation of sensitivity adjustment logic performing the Sensitivity Adjustment function 54. Each clock cycle, the sensitivity adjustment logic included in the DDCL 423 determines which branch of the Master Delay Tree circuit 31 corresponds to a period of the source clock signal and provides an output 18 indicating the corresponding branch of the Slave Delay Tree circuit 33 to be used to delay the signal DQS by the predefined percent-of-clock period delay. The output 18 in this case is encoded to indicate the slave delay tree branch by serving as a select input to the MUX 22 of the Slave Delay Tree Circuit 33.

Following are five conditions A~E implemented in the sensitivity adjustment logic to determine the Next Branch ("B(t+1)") of the Slave Delay Tree circuit 33 to be indicated by the output 18, based upon the Current Branch ("B(t)") of the Slave Delay Tree circuit 33 being indicated by the output 18. In the following, the term "Error Adjusted Branch" is the output of the Error Adjustment function 53, the term "BRANCHNUM" is the number of branches of the Slave Delay Tree circuit 33 (which is also equal to the number of branches of the Master Delay Tree circuit 31), the symbol "<" means less than, the symbol ">" means greater than, the symbol "==" means equal, and the symbol "!=" means not equal:

Condition A: [Error Adjusted Branch < (Current Branch − AS)] && [Current Branch > AS].
Condition B: [Error Adjusted Branch > (Current Branch + AS)] && [(BRANCHNUM − AS) > Current Branch].
Condition C: (Sensitivity Counter == SP).
Condition D: [Error Adjusted Branch < Current Branch] && [Current Branch != 0].
Condition E: [Error Adjusted Branch > Current Branch] && [Current Branch != BRANCHNUM − 1].

Now referring to FIG. 7, in 541, if Condition A is satisfied, then in 71, the Next Branch number is determined by decrementing the Current Branch number by one. Note that Condition A in this case is only satisfied if: (i) the Error Adjusted Branch number is less than the Current Branch number, (ii) the difference between the Current Branch number and the Error Adjusted Branch number is greater than the programmed value ("AS") of the AS field, and (iii) the Current Branch number is greater than AS. Thus, abrupt changes in the Next Branch number is avoided by only decrementing the Current Branch number by at most one rather than making the Next Branch number equal to the Error Adjusted Branch number when the Current Branch number is greater than the Error Adjusted Branch number by more than AS.

If Condition A is not satisfied, however, then in 542, it is next determined whether Condition B is satisfied. If Condition B is satisfied, then in 72, the Next Branch number is the determined by incrementing the Current Branch number by one. Note that Condition B in this case is only satisfied if: (i) the Error Adjusted Branch number is greater than the Current Branch number, (ii) the difference between the Error Adjusted Branch number and the Current Branch number is greater than AS, and (iii) the Current Branch number is less than the branch number corresponding to (BRANCHNUM− AS). Thus, abrupt changes in the Next Branch number are avoided by only incrementing the Current Branch number by at most one rather than making the Next Branch number equal to the Error Adjusted Branch number when the Error Adjusted Branch number is greater than the Current Branch number by more than AS.

If Condition B is not satisfied, then the magnitude of the difference between the Error Adjusted Branch number and the Current Branch number is less than or equal to AS. In this case, if Condition C is not satisfied in 543, then in 73, the Next Branch number is determined to be the same as the Current Branch number. Note that Condition C in this case is only satisfied if a Sensitivity Counter (not shown) in the CPL 42 has counted up to the programmed value ("SP") of the SP field. Each system clock cycle, the Sensitivity Counter increments its count by one, until the count reaches the value of SP, at which time, it stops at that count until reset. The Sensitivity Counter resets to zero when any one of the following events occur: (i) the CPL 42 is disabled, (ii) the Error Adjusted Branch number equals the Current Branch number, or (iii) Condition C is satisfied.

If Condition C is satisfied, then the Sensitivity Counter is reset and in 544, a determination is made whether Condition D is satisfied. If Condition D is satisfied, then in 74, the Next Branch number is determined by decrementing the Current Branch number by one. Note that Condition D in this case is only satisfied if: (i) the Error Adjusted Branch number is less than the Current Branch number, and (ii) the Current Branch number does not equal the lowest branch number (e.g., 0 in this example). Thus, if the difference between the Current Branch number and the Error Adjusted Branch number is less than or equal to AS, and has remained in that relationship for a period of time sufficient to allow the Sensitivity Counter to count to SP, then the Next Branch number is determined to be the Current Branch number decremented by one (unless the Current Branch number corresponds to the lowest branch in the Slave Delay Tree circuit 33).

If Condition D is not satisfied, then in 545, it is determined whether Condition E is satisfied. If Condition E is satisfied, then in 75, the Next Branch number is determined by incrementing the Current Branch number by one. On the other hand, if Condition E is not satisfied, then in 76, the Next Branch number is determined to be equal to the Current Branch number. Note that Condition E in this case is only satisfied if: (i) the Error Adjusted Branch number is greater than the Current Branch number, and (ii) the Current Branch number does not equal the highest branch number (e.g., BRANCHNUM equals one more than the highest branch number since the first branch number is labeled "0" in this example). Thus, if the difference between the Error Adjusted Branch number and the Current Branch number is less than or equal to AS, and has remained in that relationship for a period of time sufficient to allow the Sensitivity Counter to count to SP, then the Next Branch number is determined to be the Current Branch number incremented by one (unless the Current Branch number corresponds to the highest branch in the Slave Delay Tree circuit 33).

Referring back now to FIG. 5, in the Manual Override function 55~57, the branch number of the Slave Delay Tree circuit 33 determined by the Percent-Of-Period Delay Generator 400 using functions 51~54 as described above, can be overridden and replaced by a user programmable value. To perform such manual override, an Enable bit ("EN") in a control register (not shown) that is preferably included in the CPL 42 is cleared, and a Branch Select field ("BS") of a control register (not shown) that is also preferably included in the CPL 42 is programmed with a branch number. The value programmed in the BS field is preferably a value between 0 and (BRANCHNUM−1), which range covers all branches of the Slave Delay Tree circuit 33. This function is useful, among other reasons, for testing purposes as it provides a way for the user to check signal delaying across all branches of the Slave Delay Tree circuit 33. Also, it provides a useful safeguard in case of malfunction of the Percent-Of-Clock Period Delay Generator 400.

In 55, the EN bit is checked to determine whether a manual override of the Percent-Of-Clock Period Delay Generator 400 is in effect. If the EN bit is found to have been cleared, then in 57, branch number is read from the BS field and that branch number is properly encoded and provided as the control signal 18 to the Slave Delay Tree circuit 33 instead of the branch number determined through 51~54 as described above. On the other hand, if the EN bit has not been cleared, then in 56, the branch number that was determined through 51~54 is properly encoded and provided as the control signal 18 to the Slave Delay Tree circuit 33.

Although the Manual Override function 55~57 is shown as occurring after 51~54, it should be readily apparent that it could also occur before 51~54. In such a case, the Manual Override function may disable or turn-off the SYSTEM CLOCK SIGNAL to the CPL 42 and provide the control signal 18 directly to the Slave Delay Tree circuit 33. Turning off the SYSTEM CLOCK SIGNAL in this case would likely reduce the power consumed by the Percent-Of-Clock Period Delay Generator 400.

Figure 8:
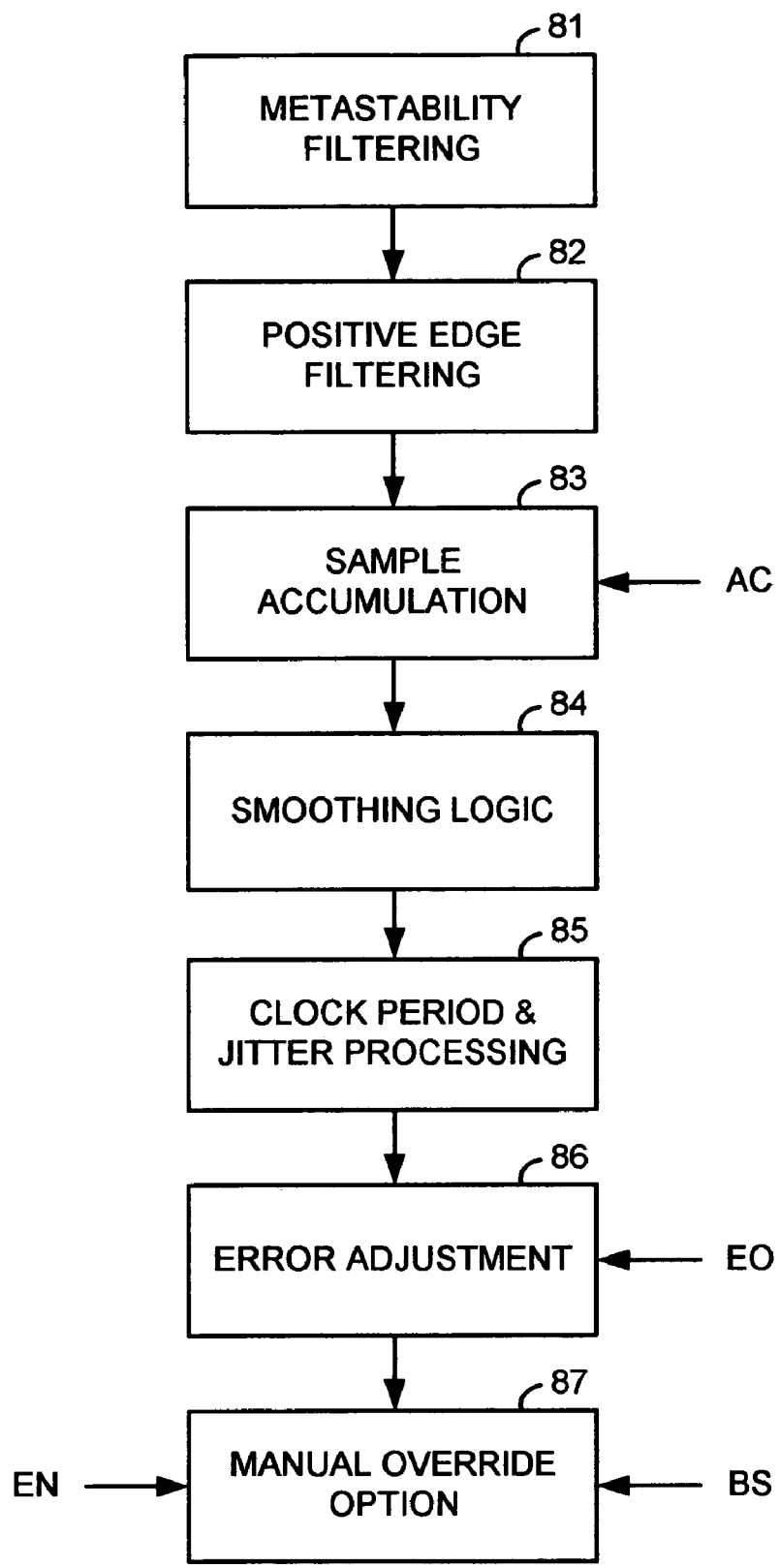
FIG. 8 illustrates, as an example, a flow diagram of various functions performed by a second embodiment of a Clock Processing Logic, utilizing aspects of the present invention.

FIG. 8 illustrates various functions performed by a second embodiment of the Clock Processing Logic 42. The DDCL 423 in this case provides enhanced edge detection and additional functionality such as on-chip clock period and clock jitter measurement after receiving the double-registered sample vector from register 422. This embodiment has the advantage of higher result accuracy, lower gate count, and better scalability (i.e., the gate count does not increase as much when branches are added to the Master Delay Tree circuit 31) relative to the first embodiment of the CPL 42 as described in reference to FIGS. 5~7. On the other hand, such advantages are achieved at the expense of higher computational latency relative to the first embodiment. In many applications, however, such higher computational latency is acceptable.

In the Metastability Filtering function 81, the Sample Vector is processed in the same manner as described in reference to the Metastability Filtering function 51 of FIG. 5. The resulting filtered Sample Vector is generally characterized by a first negative edge transition (i.e., the first occurrence starting with the bit location corresponding to delay branch 11-0 in the filtered Sample Vector of one or more "0" bits followed by one or more "1" bits) indicating the falling edge of the SOURCE CLOCK SIGNAL, and a first positive edge transition (i.e., the first occurrence starting with the bit location corresponding to delay branch 11-0 in the filtered Sample Vector of one or more "1" bits followed by one or more "0" bits) indicating the corresponding rising edge of the SOURCE CLOCK SIGNAL. Multiple negative and positive edge transitions may occur in the filtered Sample Vector if the total delay of the Master Delay Tree circuit 31 is significantly greater than the SOURCE CLOCK SIGNAL period.

Figure 9:
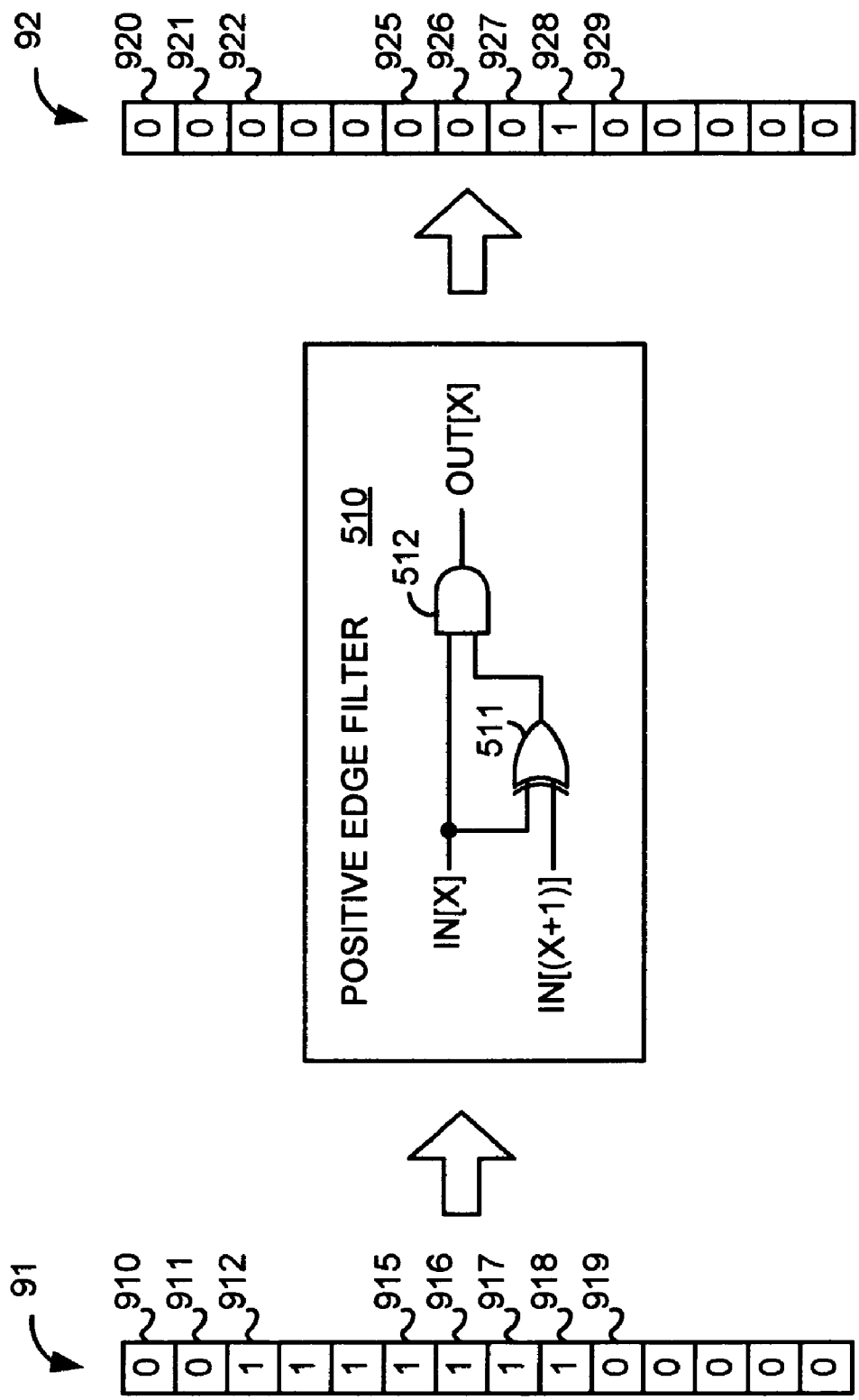
FIG. 9 illustrates, as an example, a logic diagram of a positive edge filter circuit performing a Positive Edge Filtering function included in Clock Processing Logic, utilizing aspects of the present invention.

In the Positive Edge Filtering function 82, the filtered Sample Vector is processed so that only positive edge transitions are marked in the resulting Sample Vector. FIG. 9 illustrates an example of a positive edge filter 510 used in performing the Positive Edge Filtering function 82. In this example, the positive edge filter 510 includes an Exclusive-OR gate 511 and an AND gate 512 that are coupled together so that their output OUT[X] equals "1" only if input IN[X] equals "1" and input IN[X+1] equals "0", where X and [X+1] are a pair of consecutive bit locations in both the Sample Vectors 91 and 92. For example, if bits 918 (value="1") and 919 (value="0") of the filtered Sample Vector 91 are respectively coupled to IN[X] AND IN[X+1], then OUT[X] equals "1", which value is provided as bit 928 of the resulting Sample Vector 92.

Any other combination of input values for IN[X] and IN[X+1] results in output OUT[X] equaling "0". For example, if bits 910 (value="0") and 911 (value="0") of the filtered Sample Vector 91 are respectively coupled to IN[X] AND IN[X+1], then OUT[X] equals "0", which value is provided as bit 920 of the resulting Sample Vector 92. Likewise, if bits 911 (value="0") and 912 (value="1") of the filtered Sample Vector 91 are respectively coupled to IN[X] AND IN[X+1], then OUT[X] equals "0", which value is provided as bit 921 of the resulting Sample Vector 92. Further, if bits 917 (value="1") and 918 (value="1") of the filtered Sample Vector 91 are respectively coupled to IN[X] AND IN[X+1], then OUT[X] equals "0", which value is provided as bit 927 of the resulting Sample Vector 92.

Thus, wherever a positive edge transition occurs in the filtered Sample Vector 91, the positive edge transition is marked as a "1" in the corresponding bit location of the resulting Sample Vector 92. If multiple positive edge transitions occur in the filtered Sample Vector due to the total delay of the Master Delay Tree circuit 31 being multiple times longer than the period of the SOURCE CLOCK SIGNAL, then multiple of such positive edge transitions are marked as "1" in their corresponding bit locations of the resulting Sample Vector 92.

Although only one positive edge filter 510 is shown and described in reference to FIG. 9, it is to be appreciated that in a hard-wired logic implementation of the Positive Edge Filtering function 82, there may be a number of such positive edge filters that is equal to or one less than the number of bits in the filtered Sample Vector 91. For example, where there are N bits in the Sample Vector, the $1^{st}$ through [N−1] bits of the filtered Sample Vector 91 may be coupled to respective first inputs IN[X] of (N−1) positive edge filters while the $2^{nd}$ through N bits of the filtered Sample Vector 91 are coupled to respective second inputs IN[X+1] of the (N−1) positive edge filters. Outputs OUT[X] of the (N−1) positive edge filters provide in such case provide values for the $1^{st}$ through [N−1] bit locations of the resulting Sample Vector 92. The value for the Nth bit location in this case is set to "0".

Referring back to FIG. 8, in the Sample Accumulation function 83, a predefined number of filtered Sample Vectors generated by the Positive Edge Filtering function 82 are logically OR-ed together to generate an accumulative Sample Vector. The number of filtered Sample Vectors being OR-ed together (i.e., being accumulated) in this case is determined by a value stored in an Accumulated Cycles ("AC") field of a control register (not shown) that is preferably included in the CPL 42. The resulting pattern of marked bits in the accumulative Sample Vector represents a sampled imprint of jitter on the SOURCE CLOCK SIGNAL over a period of time determined by the number of cycles of the SYSTEM CLOCK SIGNAL as specified in the AC field.

Figure 10:
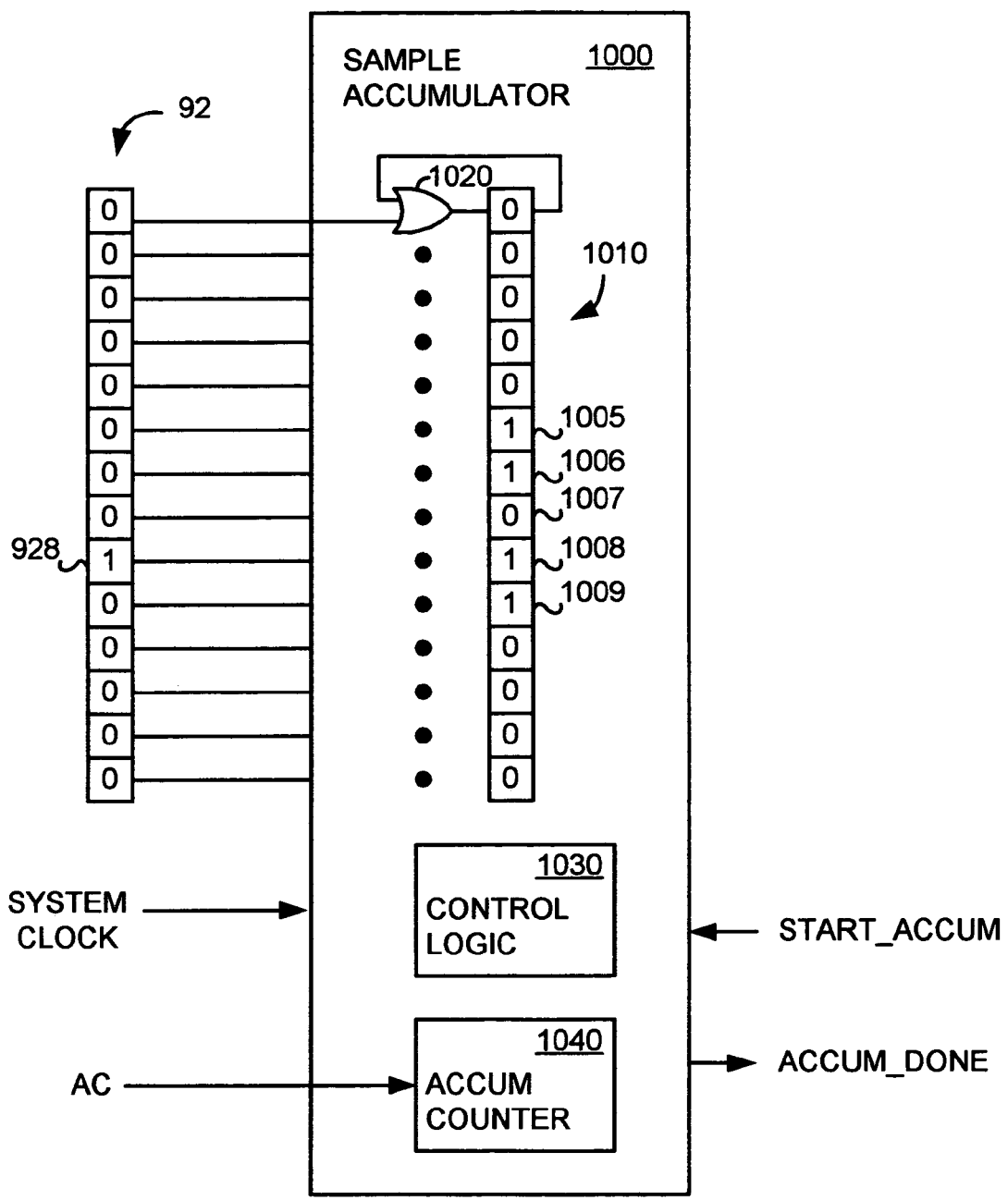
FIG. 10 illustrates, as an example, a block diagram of a sample accumulator performing a Sample Accumulation function included in Clock Processing Logic, utilizing aspects of the present invention.

An example of one implementation of the Sample Accumulation function 83 is illustrated in FIG. 10. A sample accumulator 1000 (performing the Sample Accumulation function 83) includes an accumulation register 1010, a number of OR gates (such as OR gate 1020), control logic 1030, and an accumulation counter 1040. The number of OR gates equals the number of bit locations in the Sample Vectors received from the Positive Edge Filtering function 82 as well as those generated by the Sample Accumulation function 83. Each of the OR gates is coupled to a corresponding bit location of the accumulation register 1010 so that a previously stored Sample Vector is logically OR-ed with a newly received Sample Vector (such as Sample Vector 92) from the Positive Edge Filtering function 82, and the resulting Sample Vector (i.e., outputs of the OR gates) are then stored in the accumulation register 1010 under control of the control logic 1030. Upon receiving a start indication ("START_ACCUM"), the control logic 1030 resets the accumulation register 1010 (e.g., so that all bit locations contain a "0"). The control logic 1030 then causes the outputs of the OR gates to be latched into the accumulation register 1010 each cycle to accumulate Sample Vectors until it receives an indication from the accumulation counter 1040 that the number of cycles has reached the value stored in the AC field. Upon receiving such indication, the control logic 1030 then stops accumulating Sample Vectors, and an accumulation done indication ("ACCUM_DONE") is generated. The accumulation counter 1040 starts counting after the Sample Accumulator 1000 receives the start indication, and stops counting after counting to the AC value stored in AC field. After receiving the start indication ("START_ACCUM"), the accumulation counter 1040 first resets its count back to zero, then starts counting clock cycles of the SYSTEM CLOCK SIGNAL. When the count of the accumulation counter 1040 reaches the AC value, it then generates the indication that the number of cycles has reached the AC value, and waits until receiving another start indication.

In the Smoothing Logic function 84, gaps or "0's", if present, in patterns of "1's" in the accumulated Sample Vector are eliminated in order to condition the accumulated Sample Vector for subsequent processing by the Clock Period and Jitter Processing function 85. Gaps may occur, because jitter is unpredictable and further, only a finite number of samples are being taken in the Sample Vector.

Figure 11:
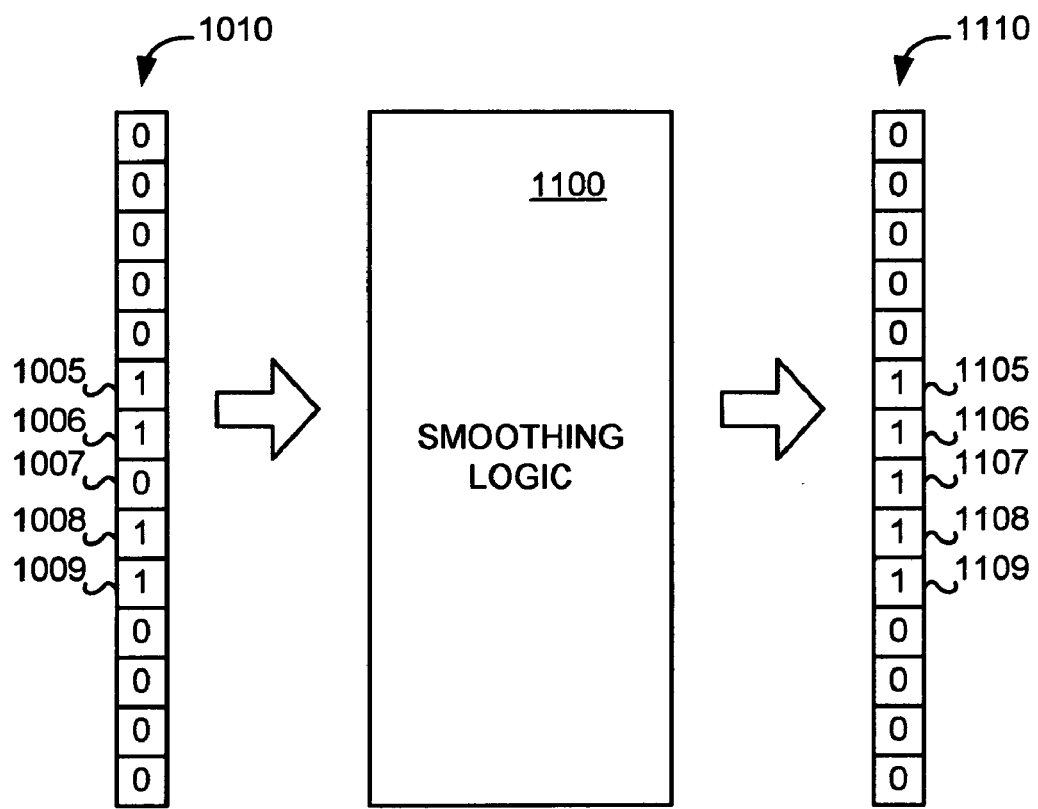
FIG. 11 illustrates, as an example, input and output Sample Vectors for a Smoothing Logic function included in Clock Processing Logic, utilizing aspects of the present invention.

The Smoothing Logic function 84 is implemented, for example, by the algorithm described in reference to the Metastability Filtering function 51 of FIG. 5. As illustrated in FIG. 11, after processing by the Smoothing Logic function 84, a gap (i.e., a "0" in a pattern of "1's") in bit location 1007 of the accumulation register 1010 (as shown in the register on the left of the smoothing logic 1100) is "eliminated" by storing a "1" value in the corresponding bit location 1107 of a temporary register 1110 while copying values stored in all other bit locations (e.g., 10xx) of the accumulation register 1010 into corresponding bit locations (e.g., 11xx) of the temporary register 1110 (as shown in the register on the right of the smoothing logic 1100). The contents of the temporary register 1110 are then used instead of those of the accumulation register 1010 for subsequently processing by the Clock Period and Jitter Processing function 85.

Figure 12:
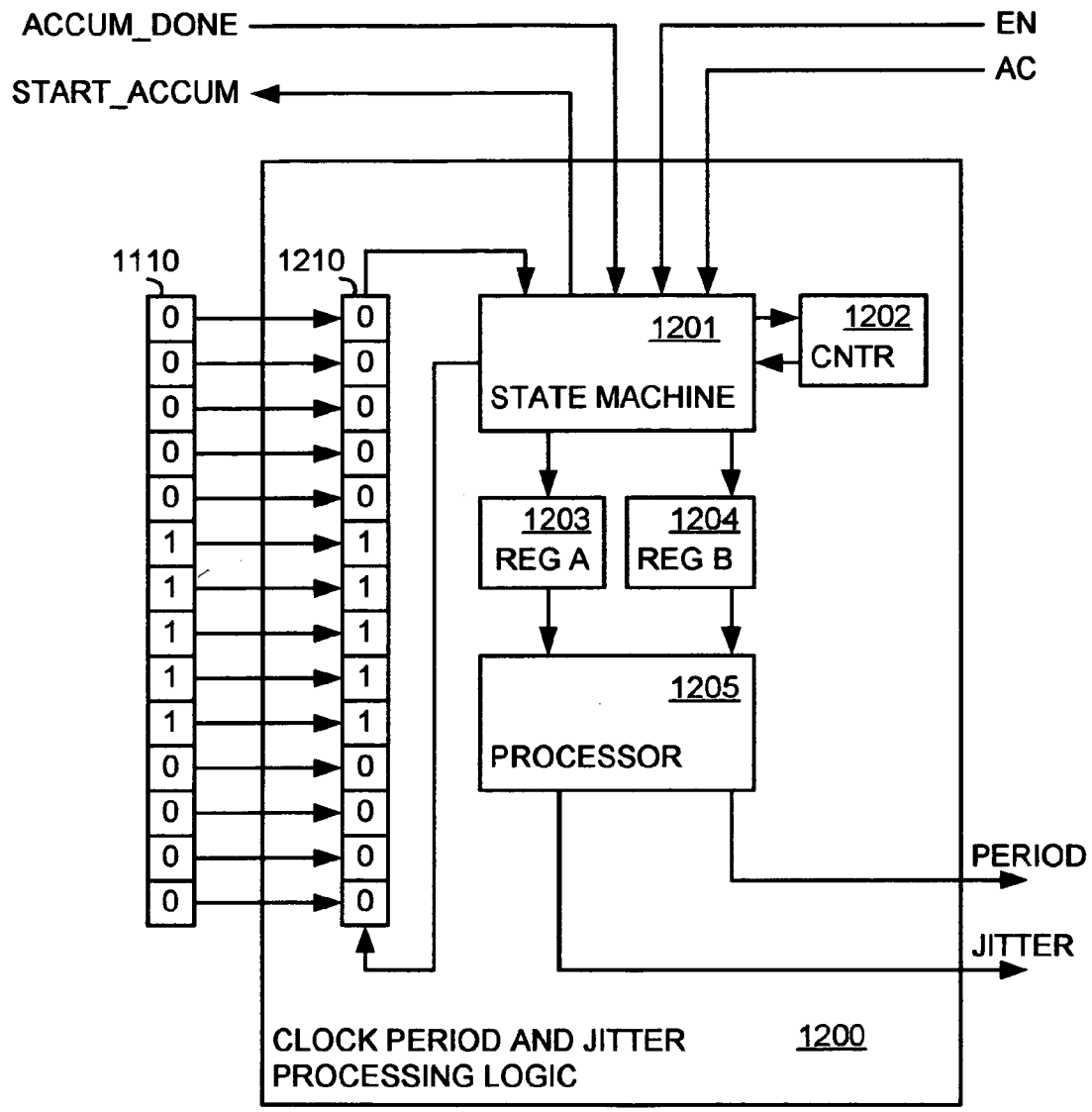
FIG. 12 illustrates, as an example, a block diagram of a clock period and jitter processing logic performing the Clock Period and Jitter Processing function of FIG. 8, utilizing aspects of the present invention.

In the Clock Period and Jitter Processing function 85, average clock periods and measurements of jitter on the SOURCE CLOCK SIGNAL are determined from accumulative Sample Vectors that have been processed by the Smoothing Logic function 84. FIG. 12 illustrates, as an example, a clock period and jitter processing logic 1200 that performs the Clock Period and Jitter Processing function 85 on the accumulated Sample Vectors. Included in the clock period and jitter processing logic 1200 are a finite state machine 1201, a counter 1202, a first statistics register ("REG A") 1203, a second statistics register ("REG B"), a processor 1205, and a shift register 1210.

Figure 13:
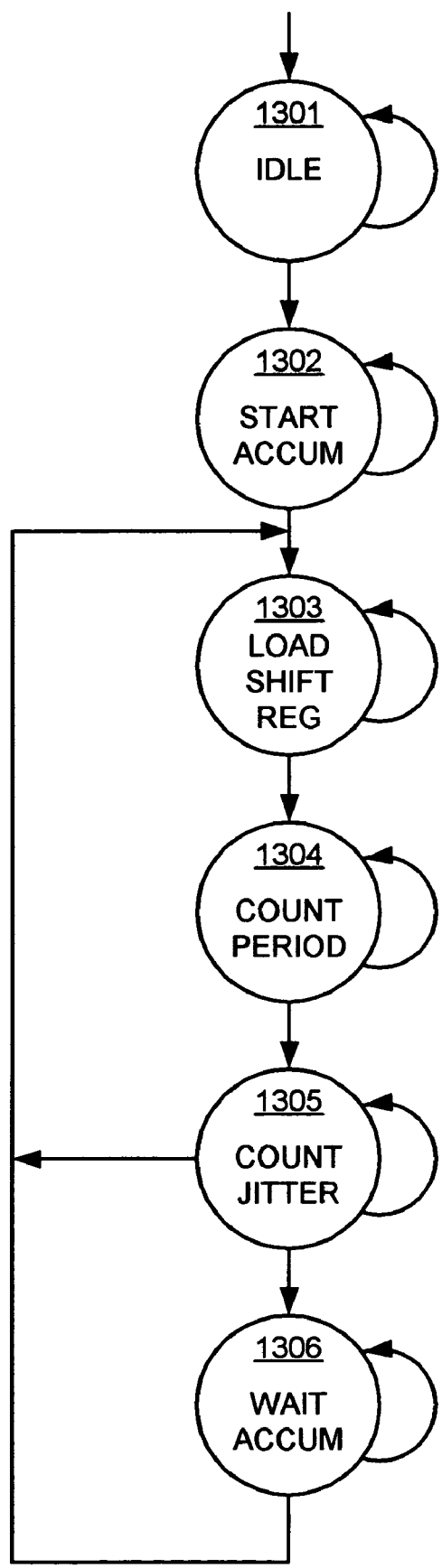
FIG. 13 illustrates, as an example, a state transition diagram for a state machine included in the clock period and jitter processing logic of FIG. 12, utilizing aspects of the present invention.

Operation of the finite state machine 1201 is illustrated in FIG. 13. In 1301, the finite state machine 1201 continuously checks the enable bit ("EN") described in reference to the Manual Override function 55~57 of FIG. 5, that indicates that the CPL 42 is enabled. If the CPL 42 is found to be enabled, then in 1302, the state machine 1201 pulses or otherwise activates the START_ACCUM signal that is provided to the Sample Accumulation function 83. The state machine 1201 then waits until it detects an assertion of or other activation indication on the ACCUM_DONE signal being received from the Sample Accumulation function 83, which indicates that an accumulated Sample Vector is ready for processing.

Once the state machine 1201 detects that the ACCUM_DONE signal has been asserted, in 1303, the state machine 1201 copies or otherwise transfers the accumulated Sample Vector that is ready for processing in the temporary register 1110 to a shift register 1210. The state machine 1201 also pulses the START_ACCUM signal again at this time so that the Sample Accumulation function 83 generates another accumulated Sample Vector while the contents of the shift register 1210 are being processed. Additionally, a counter 1202 is enabled and initialized to a value that corresponds to the number of delay elements in the first delay branch (i.e., branch 11-0) of the Master Delay Tree circuit 31. The counter 1202 is initialized to this value, because in some implementations of the Master Delay Tree circuit 31, it is possible that the first delay branch may have more delay elements than subsequent branches (i.e., branches 11-1 to 11-K). Initializing the counter 1202 to this value consequently accounts for these additional delay elements in such cases for the subsequent calculation of the clock period for the SOURCE CLOCK SIGNAL.

In 1304, starting with the first bit location of the shift register 1210 (corresponding to the first delay branch of the Master Delay Tree circuit 31), the contents of the shift register 1210 are read out at the rate of one bit location per system clock cycle. Meanwhile, the counter 1202 also counts at the same rate starting with the reading of the first bit location of the shift register 1210 by the state machine 1201. The state machine 1201 reads the contents of each bit location until it finds a value of "1" stored in a bit location. Once a value of "1" is found, the count of the counter 1202 is transferred to the second statistics register ("REG B") 1204, and the count of the counter 1202 is reset to zero and the counter 1202 is re-enabled in order to continue counting.

In 1305, the state machine 1201 then continues reading the contents of bit locations of the shift register 1210 until it finds a value of "0" stored in a bit location. Once a value of "0" is found, the state machine 1201 then transfers the count of the counter 1202 to the first statistics register ("REG A") 1203, and checks whether the ACCUM_DONE signal is being asserted again to indicate that a next accumulated Sample Vector is ready for processing. If the ACCUM_DONE signal is being so asserted, then the state machine 1201 jumps back to 1303 to start processing the next accumulated Sample Vector. On the other hand, if the ACCUM_DONE signal is not being so asserted at that time, then in 1306, the state machine 1201 waits until it detects such assertion. When the state machine 1201 does detect a next assertion of the ACCUM_DONE signal, it jumps back to 1303 to start processing the next accumulated Sample Vector.

Each time the state machine 1201 has loaded the statistics registers 1203 and 1204 with the counts from the counter 1202 as described in reference to 1304 and 1305 above, the processor 1205 calculates an average clock period and jitter from those count values. In particular, the source clock period is determined by adding one-half of the count value stored in the first register ("REG A") 1203 to the count value stored in the second register ("REG B") 1204 to determine the delay branch of the Master Delay Tree circuit 31 whose total delay time most closely matches the average period of the SOURCE CLOCK SIGNAL provided to the Master Delay Tree circuit 31 during the time of the accumulative Sample Vectors. For example, if a count of 5 has been stored in both statistics registers 1203 and 1204, then either the seventh or eighth delay branch would be selected since the calculation results in a value of seven and one-half. To effectuate dividing the bit value in the first statistics register 1203 by two, the bit values in the first statistics register 1203 are simply shifted one bit to the right. This technique saves gate count by eliminating the need for a logic divider to perform the division.

The source clock jitter, on the other hand, is simply determined by reading the count value stored in the first statistics register ("REG A") 1203. For example, if a count value of 5 has been stored in the first statistics register 1203, then the total delay time of the fifth delay branch of the Master Delay Tree circuit 31 is determined to be approximately equal to the amount of the jitter on the SOURCE CLOCK SIGNAL.

The average source clock calculated from the count values by the Clock Period and Jitter Processing function 85 is considered a more accurate indication of the first positive edge transition than that determined by the Positive Edge Detection function 52 of FIG. 5, since the delay branch corresponding to the average source clock period's count value is determined using information obtained over several clock cycles instead of just one.

In the Error Adjustment function 86, an error adjustment is applied to the source clock period's corresponding delay branch of the Master Delay Tree circuit 31, in the same manner as described in reference to the Error Adjustment function 53 of FIG. 5. Likewise, the Manual Override function 87 may be applied in the same manner as described in reference to the Manual Override function 55~57 of FIG. 5. Although a Sensitivity Adjustment function could also be applied such as that described in reference to the Sensitivity Adjustment function 54 of FIG. 5, it is not included in this case, because the Clock Period and Jitter Processing function 85 already performs an averaging operation through its source clock period calculation.

After determining the delay branch of the Master Delay Tree circuit 31 that has the same or most nearly the same total delay as the period of the SOURCE CLOCK SIGNAL provided to the Master Delay Tree circuit 31, the number of that delay branch is encoded as appropriate and provided as output 18 of the CPL 42 to the Slave Delay Tree circuit 33. The Slave Delay Tree circuit 33 then delays a signal DQS so as to generate the desired percent-of-clock period delay signal DQS'.

Figure 14:
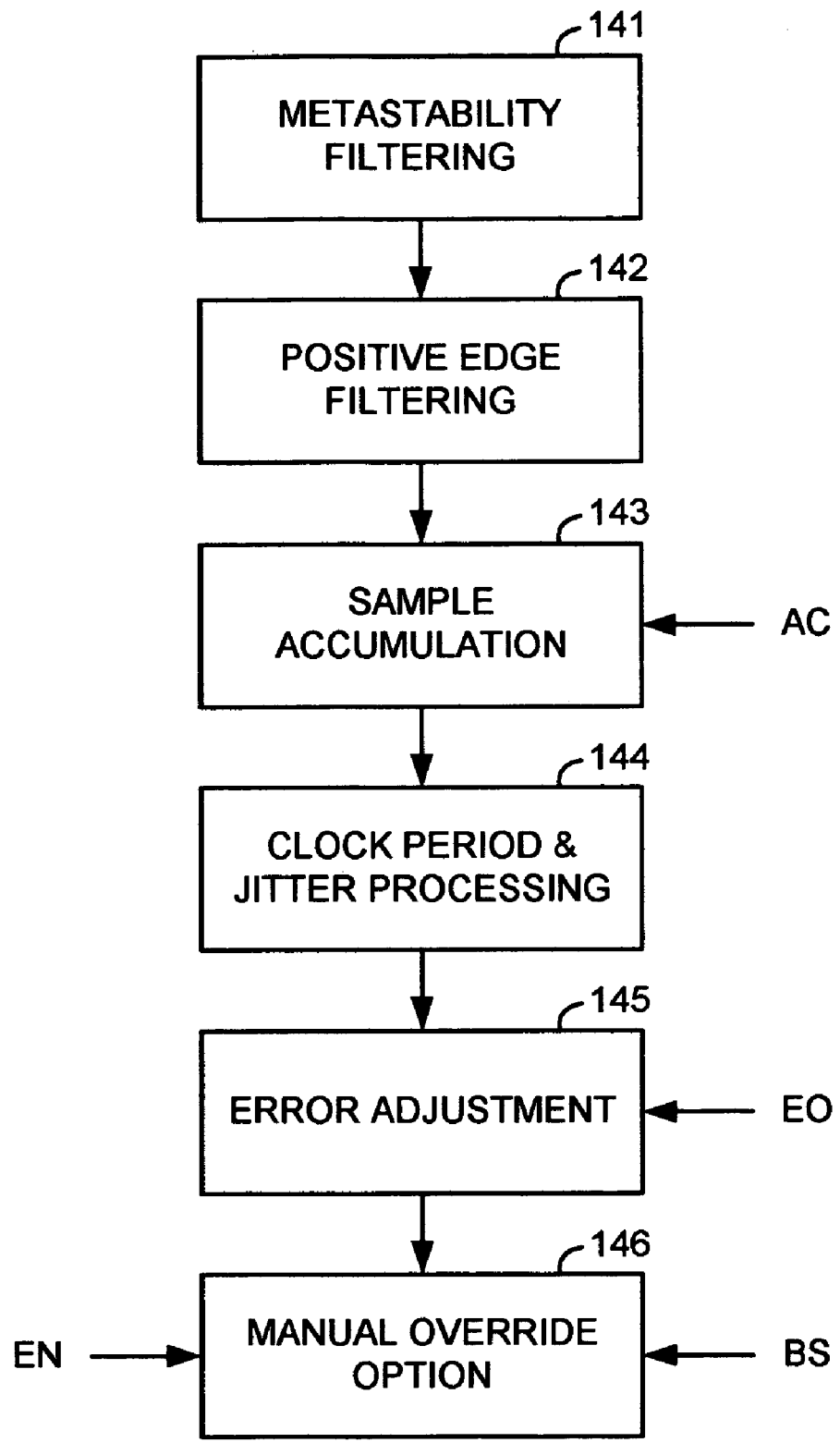
FIG. 14 illustrates, as an example, a flow diagram of various functions performed by a third embodiment of a Clock Processing Logic, utilizing aspects of the present invention.

FIG. 14 illustrates various functions performed by a third embodiment of the Clock Processing Logic 42. This embodiment primarily differs from the second embodiment described in reference to FIGS. 8~13 by eliminating the Smoothing Logic function 84 of FIG. 8 and replacing the Clock Period and Jitter Processing function 85 of FIG. 8 with the Clock Period and Jitter Processing function 144 of FIG. 14, as further described in reference to FIGS. 15~16. Functions 141, 142, 143, 145 and 146 of this third embodiment of the Clock Processing Logic 42 operate as their respective counterparts 81, 82, 83, 86, and 87 in the second embodiment of the Clock Processing Logic 42 as previously described in reference to FIGS. 8~10.

Figure 15:
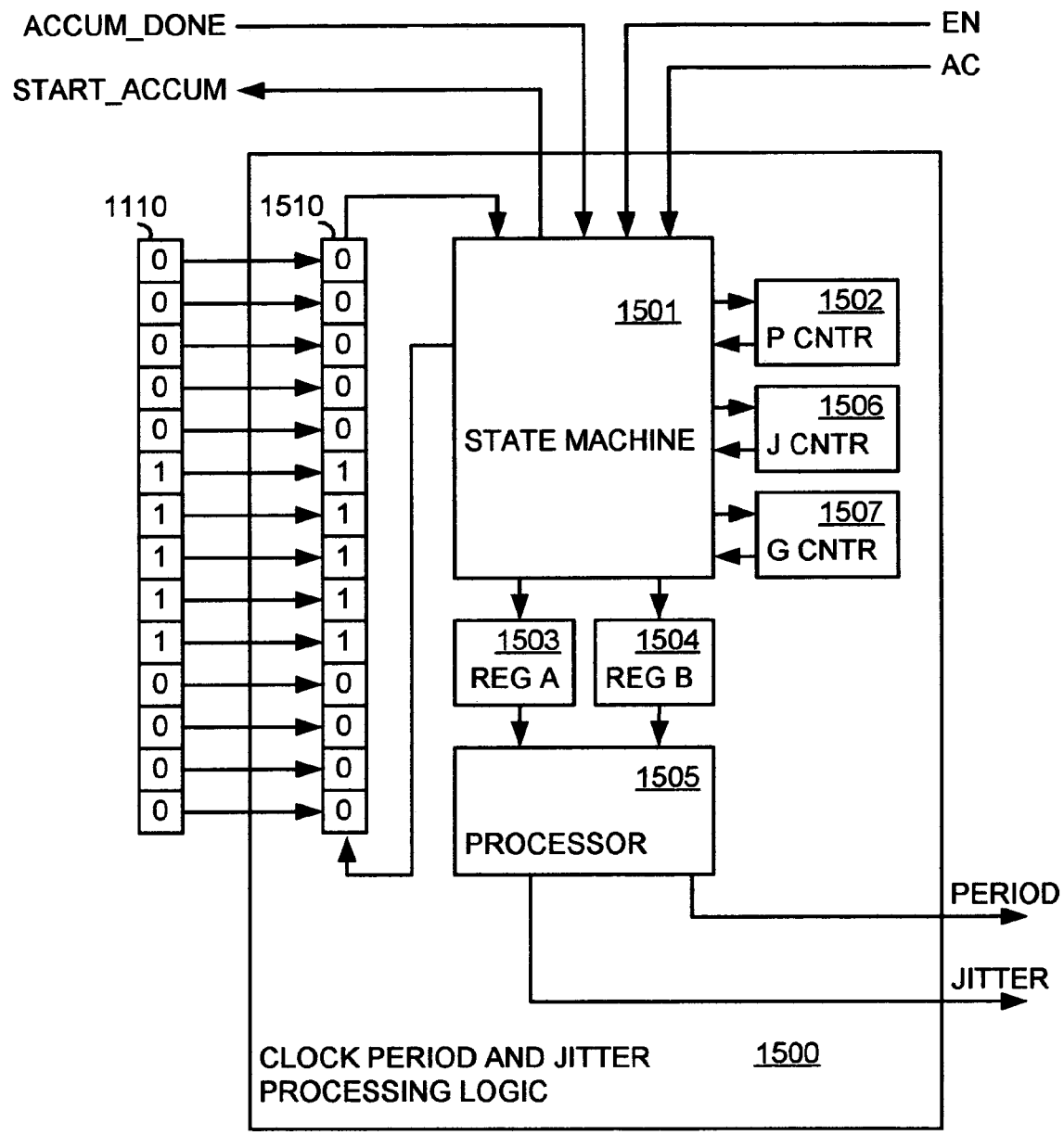
FIG. 15 illustrates, as an example, a block diagram of a clock period and jitter processing logic performing the Clock Period and Jitter Processing function of FIG. 14, utilizing aspects of the present invention.

FIG. 15 illustrates a block diagram of a clock period and jitter processing logic 1500 that performs the Clock Period and Jitter Processing function 144 on Accumulated Sample Vectors. Included in the clock period and jitter processing logic 1500 are a finite state machine 1501, a period counter ("P CNTR") 1502, a jitter counter ("J CNTR") 1506, a gap counter ("G CNTR") 1507, a first statistics register ("REG A") 1503, a second statistics register ("REG B") 1504, a processor 1505, and a shift register 1510.

Figure 16:
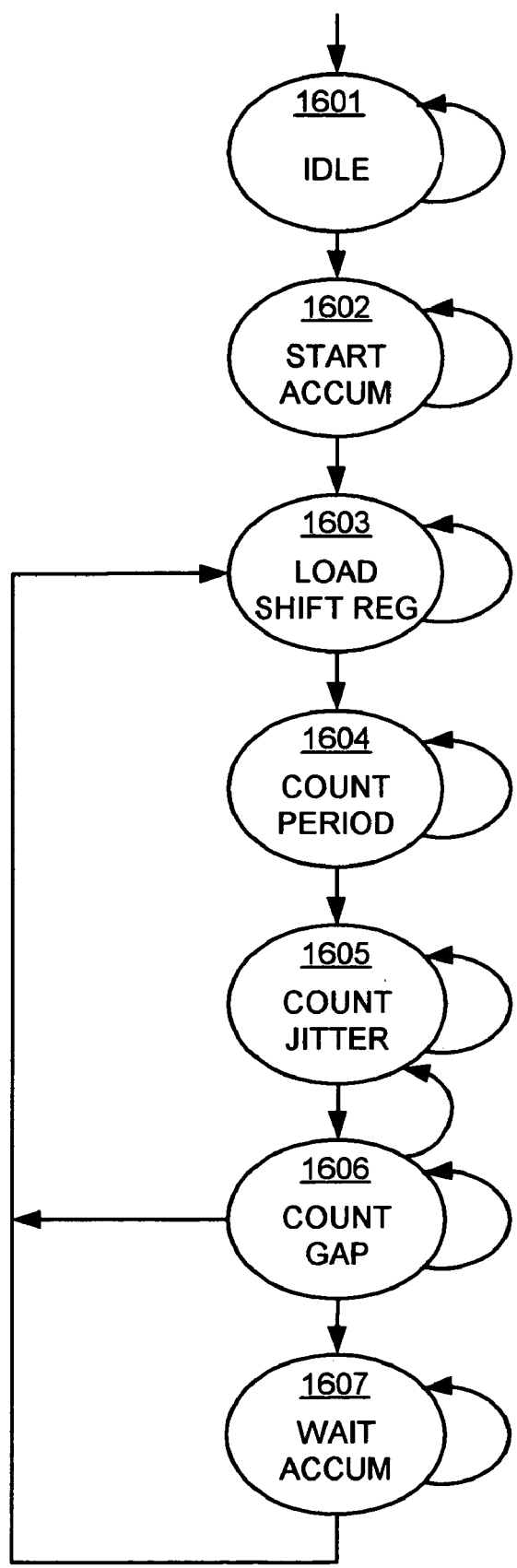
FIG. 16 illustrates, as an example, a state transition diagram for a state machine included in the clock period and jitter processing logic of FIG. 15, utilizing aspects of the present invention.

Operation of the finite state machine 1601 is illustrated in FIG. 16. States 1601 and 1602 of FIG. 16 operate identically as respectively corresponding states 1301 and 1302 of FIG. 13.

In 1603, the state machine 1501 copies or otherwise transfers the accumulated Sample Vector that is ready for processing in the temporary register 1110 to the shift register 1510. The state machine 1501 also pulses the START_ACCUM signal (e.g., pulls it high to a value "1") so that the Sample Accumulation function 143 generates another accumulated Sample Vector while the contents of the shift register 1510 are being processed. The state machine 1501 also initializes the period counter 1502 to a value that corresponds to the number of delay elements in the first delay branch of the Master Delay Tree circuit 31. The state machine 1501 also resets the jitter counter 1506, the gap counter 1507, and the first and second statistics registers 1503 and 1504 to zero values.

In 1604, starting with the first bit location (corresponding to the first delay branch of the Master Delay Tree circuit 31) of the shift register 1510, the contents of the shift register 1510 are read out at the rate of one bit location per system clock cycle. Meanwhile, the state machine 1501 enables the period counter 1502 so that it is also counting at the same rate starting with the reading of the first bit location of the shift register 1510 by the state machine 1501. The state machine 1501 then reads the contents of each bit location until it finds a value of "1" stored in a bit location. Once a value of "1" is found, the state machine 1501 halts the period counter 1502, and causes its then current count to be copied to the second statistics register ("REG B") 1504.

In 1605, the state machine 1501 enables the jitter counter 1506, and continues reading contents of the shift register 1510 until it finds a value of "0" stored in a bit location. Once a value of "0" is found, the state machine 1501 causes the then current count of the jitter counter 1506 to be copied to the first statistics register ("REG A") 1503. The jitter counter 1506 is allowed to continue counting, however.

In 1606, the state machine 1501 enables the gap counter 1507, and continues reading contents of the shift register 1510 until either it finds a value of "1" stored in a bit location or it counts up to a limit value such as one-half of the count stored in the second status register ("REG B") 1504 (i.e., a limit value equivalent to a count that corresponds to one half of the low end of the SOURCE CLOCK SIGNAL with jitter).

If the gap counter 1507 does not find a value of "1" before reaching the limit value, then the state machine 1501 checks whether the ACCUM_DONE signal is being asserted again at that time to indicate that a next accumulated Sample Vector is ready for processing. If the ACCUM_DONE signal is being asserted, then the state machine 1501 returns to 1603 to process the next accumulated Sample Vector. If the ACCUM_DONE signal is not being asserted, however, then in 1607, the state machine 1501 waits until it detects such assertion. When the state machine 1501 does detect a next assertion of the ACCUM_DONE signal, it returns to 1603 to process the next accumulated Sample Vector.

On the other hand, if the gap counter 1507 does find a value of "1" stored in a bit location before reaching the limit value in 1606, then the state machine 1501 resets the gap counter 1507 to zero, and jumps back to 1605.

Calculations for the period and jitter are then performed by the processor 1505 in the same fashion as described in reference to the processor 1205 of FIG. 12.

Information of the source clock period and jitter as determined by the Clock Period and Jitter Processing function 85 of FIG. 8 or 144 of FIG. 14 may also be useful for other applications other than generating a percent-of-clock period delay signal within the same system as the Percent-of-Clock Period Delay Generator 400. In such case, such information of the source clock period and jitter are stored in appropriate registers accessible to a Central Processing Unit (not shown) in the system.

One particular advantage of the Clock Processing Logic 42 is that it is conducive to on-chip measurement of clock or other digital signal edge characteristics in a voltage and/or temperature varying environment. In particular, the embodiments of the Clock Processing Logic 42 described in reference to FIGS. 8~16 are capable of performing clock period and jitter measurement of an on-chip clock and make those measurements available to off-chip resources through registers storing the measurement information. Such a capability is particularly useful in situations where on-chip clocks need to be characterized and their signals cannot be readily provided off-chip due to pin-count or frequency restrictions on the chip's input/output pad circuitry. It is also useful even where on-chip signals can be provided off-chip, because it eliminates the need for expensive equipment to perform such measurements, the time consumed in setting such equipment up, and the inconvenience of ensuring that such testing be done in a proper test environment.

It is noteworthy that the clock period may be estimated by multiplying the nominal delay value of a delay element by the number of delay elements in the delay branch of the Master Delay Tree circuit 31 that has been determined to have the same or most nearly the same total delay as the period of the SOURCE CLOCK SIGNAL provided to the Master Delay Tree circuit 31. The nominal delay value for such calculation is preferably determined by taking into account (i.e., correlating) the process, temperature and reference voltage conditions under which the clock period is being estimated against pre-calculated delay values for different processes, temperatures, and reference voltages.

Although the various aspects of the present invention have been described with respect to a preferred embodiment, it will be understood that the invention is entitled to full protection within the full scope of the appended claims.

We claim:

1. A clock processing logic for determining an average clock period and jitter for a first clock signal characterized by sample vectors taken on a per cycle basis of said first clock signal, wherein individual of said sample vectors indicate at least one edge of said first clock signal by a bit location varying from cycle to cycle according to reference voltage and temperature variations affecting said first clock signal and corresponding to a transition from one or more bits of a first value on one side of said bit location to one or more bits of a second value on another side of said bit location, comprising:
   an edge filter configured to generate filtered sample vectors by marking only bit locations corresponding to edges of said first clock signal as indicated in said sample vectors;
   sample accumulation logic configured to generate accumulative sample vectors by logically OR-ing a predefined number of said filtered sample vectors for individual of said accumulative sample vectors; and
   clock period and jitter processing logic configured to determine a clock period and jitter on said first clock signal for individual of said accumulative sample vectors.

2. The clock processing logic according to claim 1, further comprising a metastability filter configured to correct errors in said sample vectors due to metastability problems when capturing said sample vectors.

3. The clock processing logic according to claim 1, wherein said edge filter marks only positive edges of said sample vectors, wherein a positive edge is defined as a bit location corresponding to a transition from one or more bits of a first value on one side of said bit location to one or more bits of a second value on another side of said bit location.

4. The clock processing logic according to claim 3, wherein said first value is a "1" and said second value is a "0".

5. The clock processing logic according to claim 4, wherein said edge filter comprises:
   an AND gate having a first AND-input, a second AND-input, and an AND-output, wherein said first AND-input is coupled to a bit location of a sample vector, and said AND-output is coupled to a corresponding bit location of said filtered sample vector; and
   an exclusive-OR gate having a first XOR-input, a second XOR-input, and an XOR-output, wherein said first XOR-input is coupled to said bit location of said sample vector, said second XOR-input is coupled to a next bit location of said sample vector, and said XOR-output is coupled to said second AND-input.

6. The clock processing logic according to claim 1, wherein said sample accumulation logic comprises:
   an accumulation register having a plurality of bit locations equal in number to individual of said sample vectors;

a plurality of OR-gates respectively coupled to corresponding bit locations of said accumulation register such that individual of said plurality of OR-gates have a first OR-input coupled to receive an output from a corresponding bit location of said accumulation register, a second OR-input coupled to a corresponding bit location of a filtered sample vector, and an OR-output coupled to provide an input to said corresponding bit location of said accumulation register; and control logic configured to latch said OR-outputs of said plurality of OR-gates into said corresponding bit locations of said accumulation register upon each clock cycle of a second clock signal for a predefined number of clock cycles.

7. The clock processing logic according to claim 6, wherein said sample accumulation logic further comprises an accumulation counter incremented by said second clock signal and indicating to said control logic when said predefined number of clock cycles has been counted.

8. The clock processing logic according to claim 1, wherein said clock period and jitter processing logic comprises:

a shift register configured to receive accumulative sample vectors one at a time from said sample accumulation logic;

first and second registers; and a state machine configured to cause an accumulative sample vector to be loaded into said shift register upon receiving an indication that said accumulative sample vector is ready to be so loaded; read bits from said shift register at the rate of one bit per cycle of a second clock signal; store a first count in said second register indicating a number of bits read before a first pair of consecutive bits being read out from said shift register transition from a second value to a first value; and store a second count in said first register indicating a number of additional bits read before a second pair of consecutive bits being read out from said shift register transition from said first value to said second value.

9. The clock processing logic according to claim 8, wherein said clock period and jitter processing logic further comprises control logic configured to determine an average clock period and jitter for said first clock signal from said first and said second counts respectively stored in said second and said first registers.

10. The clock processing logic according to claim 9, wherein said control logic determines said average clock period from a sum of said first count and one-half of said second count, and determines said jitter from said second count.

11. The clock processing logic according to claim 8, further comprising smoothing logic configured to eliminate gaps between markings indicated in individual of said accumulative sample vectors before said individual of said accumulative sample vectors are loaded into said shift register.

12. The clock processing logic according to claim 8, wherein said state machine overwrites said second count with a third count in said first register if another bit having said first value is read out of said shift register after reading out said second pair of consecutive bits and before reading out an additional number of bits equal to a pre-selected fraction of said first count.

13. The clock processing logic according to claim 8, wherein said first clock signal and said second clock signal are the same clock signal.

14. A method for determining an average clock period and jitter for a first clock signal characterized by sample vectors taken on a per cycle basis of said first clock signal, wherein individual of said sample vectors indicate at least one edge of said first clock signal by a bit location varying from cycle to cycle according to reference voltage and temperature variations affecting said first clock signal and corresponding to a transition from one or more bits of a first value on one side of said bit location to one or more bits of a second value on another side of said bit location, comprising:

generating filtered sample vectors by marking only bit locations corresponding to edges of said first clock signal as indicated in said sample vectors;

generating accumulative sample vectors by logically ORing a predefined number of said filtered sample vectors for individual of said accumulative sample vectors; and determining a clock period and jitter on said first clock signal for individual of said accumulative sample vectors.

15. The method according to claim 14, further comprising correcting errors in said sample vectors due to metastability problems when capturing said sample vectors.

16. The method according to claim 14, wherein said determining a clock period and jitter on said clock signal for individual of said accumulative sample vectors, comprises:

loading an accumulative sample vector into a shift register upon receiving an indication that said accumulative sample vector is ready to be so loaded;

reading bits from said shift register at the rate of one bit per cycle of a second clock signal;

storing a first count in a second register indicating a number of bits read before a first pair of consecutive bits being read out from said shift register transition from a second value to a first value; and storing a second count in a first register indicating a number of additional bits read before a second pair of consecutive bits being read out from said shift register transition from said first value to said second value.

17. The method according to claim 16, further comprising: determining an average clock period and jitter for said first clock signal from said first and said second counts respectively stored in said second and said first registers.

18. The method according to claim 17, wherein said average clock period is determined from a sum of said first count and one-half of said second count, and said jitter is determined from said second count.

19. The method according to claim 16, further comprising eliminating gaps between markings indicated in individual of said accumulative sample vectors before loading said individual of said accumulative sample vectors into said shift register.

20. The method according to claim 16, further comprising overwriting said second count with a third count in said first register if another bit having said first value is read out of said shift register after reading out said second pair of consecutive bits and before reading out an additional number of bits equal to a pre-selected fraction of said first count.

21. The clock processing logic according to claim 20, wherein said first clock signal and said second clock signal are the same clock signal.

* * * * *

UNITED STATES PATENT AND TRADEMARK OFFICE
CERTIFICATE OF CORRECTION

| | |
|---|---|
| PATENT NO. | : 7,061,294 B1 |
| APPLICATION NO. | : 11/042395 |
| DATED | : June 13, 2006 |
| INVENTOR(S) | : Talledo et al. |

It is certified that error appears in the above-identified patent and that said Letters Patent is hereby corrected as shown below:

Col 9, line 26 that portion of the algorithm reading "in[1]" should read --in[i]--

Signed and Sealed this

Twenty-sixth Day of December, 2006

JON W. DUDAS
*Director of the United States Patent and Trademark Office*